United States Patent
Ben-Eliezer et al.

(10) Patent No.: US 11,360,173 B2
(45) Date of Patent: Jun. 14, 2022

(54) METHOD AND SYSTEM FOR MAPPING TRANSVERSE RELAXATION IN MAGNETIC RESONANCE SCAN

(71) Applicant: Ramot at Tel-Aviv University Ltd., Tel-Aviv (IL)

(72) Inventors: Noam Ben-Eliezer, Tel-Aviv (IL); Natalie Bnaiahu, Tel-Aviv (IL)

(73) Assignee: Ramot at Tel-Aviv University Ltd., Tel-Aviv (IL)

( * ) Notice: Subject to any disclaimer, the term of this patent is extended or adjusted under 35 U.S.C. 154(b) by 0 days.

(21) Appl. No.: 17/318,123

(22) Filed: May 12, 2021

(65) Prior Publication Data
US 2021/0356542 A1 Nov. 18, 2021

Related U.S. Application Data

(60) Provisional application No. 63/023,319, filed on May 12, 2020.

(51) Int. Cl.
*G01R 33/50* (2006.01)
*G01R 33/561* (2006.01)
(Continued)

(52) U.S. Cl.
CPC ......... *G01R 33/50* (2013.01); *G01R 33/5602* (2013.01); *G01R 33/5608* (2013.01); *G01R 33/5618* (2013.01); *G01R 33/56341* (2013.01)

(58) Field of Classification Search
None
See application file for complete search history.

(56) References Cited

U.S. PATENT DOCUMENTS

| | | | |
|---|---|---|---|
| 10,281,544 B2 | 5/2019 | Ben-Eliezer et al. | |
| 2011/0052031 A1* | 3/2011 | Feiweier | G01R 33/56518 324/309 |

(Continued)

OTHER PUBLICATIONS

Ben-Eliezer et al. "Accelerated and Motion-Robust In Vivo T2 Mapping From Radially Undersampled Data Using Bloch-Simulation-Based Iterative Reconstruction", Magnetic Resonance in Medicine, 75(3): 1346-1354, Published online Apr. 17, 2015.

(Continued)

*Primary Examiner* — Gregory H Curran

(57) ABSTRACT

A method of mapping transverse relaxation in a magnetic resonance (MR) scan data, comprises receiving a multi-echo spin-echo MR scan protocol comprising a plurality of MR imaging parameters, and for each echo of the multi-echo spin-echo MR scan protocol: generating, based on the parameters, a simulated echo modulation curve using a set of refocusing coherence pathways, for each of a plurality of predetermined transverse relaxation times; calculating, for each transverse relaxation time, diffusion attenuation based on a respective subset of the refocusing coherence pathways; and correcting the echo modulation curve using the diffusion attenuation. The method can also comprise comparing the scan data to the corrected echo modulation curve for each of at least a portion of the transverse relaxation values, and generating a displayed output comprising a map of transverse relaxation based on the comparison.

20 Claims, 11 Drawing Sheets
(7 of 11 Drawing Sheet(s) Filed in Color)

(51) Int. Cl.
*G01R 33/56* (2006.01)
*G01R 33/563* (2006.01)

(56) References Cited

U.S. PATENT DOCUMENTS

| | | | | |
|---|---|---|---|---|
| 2012/0049845 | A1* | 3/2012 | Bito | G01R 33/485 324/309 |
| 2016/0157746 | A1* | 6/2016 | Ellingson | G01R 33/56341 600/420 |

OTHER PUBLICATIONS

Ben-Eliezer et al. "Rapid and Accurate T2 Mapping From Multi-Spin-Echo Data Using Bloch-Simulation-Based Reconstruction", Magnetic Resonance in Medicine, 73(2): 809-817, Published Online Mar. 19, 2014.

Eitel et al. "T2-Weighted Cardiovascular Magnetic Resonance in Acute Cardiac Disease", Journal of Cardiovascular Magnetic Resonance, 13(1): 13-1-13-11, Feb. 18, 2011.

Farraher et al. "Differentiation of Hepatocellular Carcinoma and Hepatic Metastasis From Cysts and Hemangiomas With Calculated T2 Relaxation Times and the T1/T2 Relaxation Times Ratio", Journal of Magnetic Resonance Imaging, 24(6): 1333-1341, Published Online Nov. 2, 2006.

Jordan et al. "Musculoskeletal MRI at 3.0T and 7.0T: A Comparison of Relaxation Times and Image Contrast", European Journal of Radiology, 82(5): 734-739, Published Online Dec. 14, 2011.

Lebel et al. "Transverse Relaxometry With Stimulated Echo Compensation", Magnetic Resonance in Medicine, 64(4): 1005-1014, Published Online Jun. 17, 2010.

McCreary et al. "Multicomponent T2 Analysis of Rat Brain and Spinal Cord at 9.4 T", Proceedings of the 14th International Society of Magnetic Resonance in Medicine, Seattle, WA, USA, May 6-12, 2006, 14: 961, Poster, May 6, 2006.

McPhee et al. "Limitations of Skipping Echoes for Exponential T2 Fitting", Journal of Magnetic Resonance Imaging, 48(5): 1432-1440, Published Online Apr. 17 208.

Oakden et al. "Effects of Diffusion on High-Resolution Quantitative T2 MRI", NMR in Biomedicine, 27(6): 672-680, Published Online Apr. 2, 2014.

Oakden et al. "Quantitative MRI in A Non-Surgical Model of Cervical Spinal Cord Injury", NMR in Biomedicine, 28(8): 925-936, Published Online Jun. 4, 2015.

Shepherd et al. "New Rapid, Accurate T2 Quantification Detects Pathology in Normal-Appearing Brain Regions of Relapsing-Remitting MS Patients", NueoImage: Clinical, 14: 363-370, Available Online Feb. 3, 2017.

Zhang et al. "Magnetic Resonance Imaging of Mouse Skeletal Muscle to Measure Denervation Atrophy", Experimental Neurology, 212(2): 448-457, Available Online May 10, 2008.

\* cited by examiner

METHOD AND SYSTEM FOR MAPPING TRANSVERSE RELAXATION IN MAGNETIC RESONANCE SCAN

RELATED APPLICATION(S)

This application claims the benefit of priority under 35 USC § 119(e) of U.S. Provisional Patent Application No. 63/023,319 filed on May 12, 2020, the contents of which are all incorporated by reference as if fully set forth herein in their entirety.

FIELD AND BACKGROUND OF THE INVENTION

The present invention, in some embodiments thereof, relates to magnetic resonance mapping and, more particularly, but not exclusively, to a method and system for generating transverse relaxation map in magnetic resonance scan. Optionally, the method and system generate transverse relaxation map in preclinical magnetic resonance scan.

Magnetic Resonance Imaging (MRI) is a method to obtain an image representing the chemical and physical microscopic properties of materials, by utilizing a quantum mechanical phenomenon, named Nuclear Magnetic Resonance (NMR), in which a system of spins, placed in a magnetic field resonantly absorb energy, when applied with a certain frequency.

A nucleus can experience NMR only if it has a nonzero nuclear spin 'I', i.e., the nucleus has at least one unpaired nucleon. Examples of non-zero spin nuclei frequently used in MRI include $^1$H (I=1/2), $^2$H (I=1), $^{23}$Na (I=3/2), etc. When placed in a magnetic field, a nucleus having a spin I is allowed to be in a discrete set of energy levels, the number of which is determined by I, and the separation of which is determined by the gyromagnetic ratio of the nucleus and by the magnetic field. Under the influence of a small perturbation, manifested as a radiofrequency magnetic field, which rotates about the direction of a primary static magnetic field, the nucleus has a time dependent probability to experience a transition from one energy level to another. With a specific frequency of the rotating magnetic field, the transition probability may reach the value of unity. Hence at certain times, a transition is forced on the nucleus, even though the rotating magnetic field may be of small magnitude relative to the primary magnetic field. For an ensemble of spin I nuclei the transitions are realized through a change in the overall magnetization.

Once a change in the magnetization occurs, a system of spins tends to restore its magnetization to a longitudinal equilibrium value, by the thermodynamic principle of minimal energy. The time constant which control the elapsed time for the system to return to the equilibrium value is called "spin-lattice relaxation time" or "longitudinal relaxation time" and is denoted as $T_1$. An additional time constant, $T_2$ ($\leq T1$), called "spin-spin relaxation time" or "transverse relaxation time", controls the elapsed time in which the transverse magnetization diminishes, by the principle of maximal entropy.

In MRI, a static magnetic field having a gradient is applied on an object, thereby creating, at each region of the object, a unique magnetic field. By detecting the NMR signal, knowing the magnetic field gradient, the position of each region of the object can be imaged. In many MRI techniques, differences between characteristic $T_2$ values are used to create visually qualitative contrast in the magnetic resonance image. It is however recognized that further information can be obtained by quantitative characterization of $T_2$ at each region of the substance under investigation.

U.S. Pat. No. 10,281,544, the contents of which are hereby incorporated by reference, discloses a technique that improves quantification of the $T_2$ time using fast multi spin-echo sequences. Time-efficient computer simulations that are governed by the Bloch equations are employed for exact modeling of spurious stimulated echoes in multi-dimensional MRI runs. A plurality of parameters are used to produce echo modulation curves prior to correcting distorted experimental data based on pre-calculated simulation values.

SUMMARY OF THE INVENTION

According to an aspect of some embodiments of the present invention there is provided a method of mapping transverse relaxation in a magnetic resonance (MR) scan data, optionally and preferably data describing a preclinical MR scan. The method comprises receiving a multi-echo spin-echo MR scan protocol comprising a plurality of MR imaging parameters. The method also comprises, for each echo of the multi-echo spin-echo MR scan protocol: generating, based on the parameters, a simulated echo modulation curve using a set of refocusing coherence pathways, for each of a plurality of predetermined transverse relaxation times; calculating, for each transverse relaxation time, diffusion attenuation based on a respective subset of the refocusing coherence pathways; and correcting the echo modulation curve using the diffusion attenuation. The method can also comprise comparing the scan data to the corrected echo modulation curve for each of at least a portion of the transverse relaxation values, and generating a displayed output comprising a map of transverse relaxation based on the comparison.

According to some embodiments of the invention the calculation of the diffusion attenuation comprises calculating a b-value characterizing a diffusion for each coherence pathway of the subset.

According to some embodiments of the invention the diffusion attenuation comprises a weighted sum of b-values of different coherence pathway.

According to some embodiments of the invention the method comprises calculating weights for the weighted sum as relative contributions of a respective coherence pathway to a magnetization of the echo.

According to some embodiments of the invention the calculation of the diffusion attenuation comprises partitioning a simulated slice profile into a plurality of partitions, and assigning a spin flip angle to each partition.

According to some embodiments of the invention the method comprises applying Extended Phase Graph (EPG) procedure to determine the subset of coherence pathways that contribute to each echo and to each partition to provide a magnetization value for the partition.

According to an aspect of some embodiments of the present invention there is provided a method of generating calibration data for an MR scanner, optionally and preferably a preclinical MR scanner. The method comprises receiving a multi-echo spin-echo MR scan protocol comprising a plurality of MR imaging parameters. The method also comprises, for each echo of the multi-echo spin-echo MR scan protocol: generating, based on the parameters, a simulated echo modulation curve using a set of refocusing coherence pathways, for each of a plurality of predetermined transverse relaxation times; calculating, for each transverse relaxation time, diffusion attenuation based on a respective subset of the refocusing coherence pathways; correcting the echo modulation curve using the diffusion attenuation; and storing the corrected echo modulation curves in a computer readable medium.

According to some embodiments of the invention the MR scanner has a bore size of less than 40 cm.

According to an aspect of some embodiments of the present invention there is provided a method of mapping transverse relaxation in MR scan data acquired by an MR scanner according to a multi-echo spin-echo MR scan protocol comprising a set of MR imaging parameters. The method comprises accessing a computer readable medium storing calibration data. The calibration data comprises a plurality of simulated echo modulation curves that are identified as corresponding to the set of MR imaging parameters, wherein each echo modulation curve corresponds to a unique transverse relaxation value. The calibration data can be generated as delineated above and optionally and preferably as further detailed below. The method also comprises comparing the scan data to the echo modulation curve for each of at least a portion of said transverse relaxation values, and generating a displayed output comprising a map of transverse relaxation based on said comparison.

According to some embodiments of the invention the magnetic resonance (MR) scan data are characterized by typical gradient amplitudes of at least 100 mT/m.

According to some embodiments of the invention the magnetic resonance (MR) scan data are characterized by spatial resolution of less than 300 μm×300 μm×1 mm.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a low-field desktop MRI system (such as, but not limited to, a system marketed by ASPECT Imaging Ltd.), a chip, or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

The patent or application file contains at least one drawing executed in color. Copies of this patent or patent application publication with color drawing(s) will be provided by the Office upon request and payment of the necessary fee.

Some embodiments of the invention are herein described, by way of example only, with reference to the accompanying drawings and images. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 1 is a flowchart diagram of a method suitable for mapping transverse relaxation in MR scan data according to some embodiments of the present invention.

FIG. 2 is a flowchart diagram of a method suitable for mapping transverse relaxation in MR scan data using calibration data prepared in advance, according to some embodiments of the present invention.

FIG. 3 is a schematic illustration of seven 5 mm tubes scanned during MR spectroscopy experiments, performed according to some embodiments of the present invention.

Figure 4:
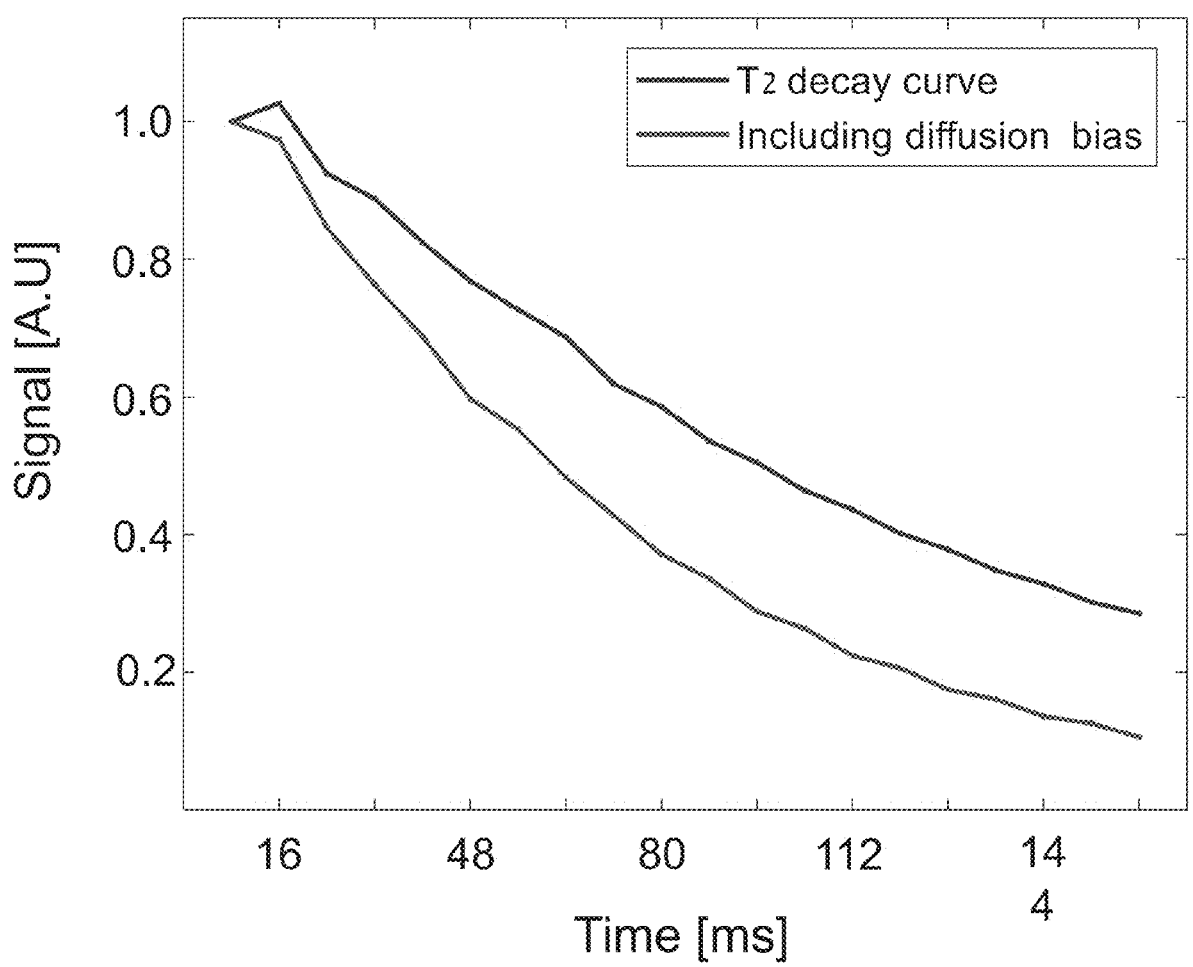

FIG. 4 shows an effect of diffusion on $T_2$ decay curve in simulated multi-echo spin-echo (MESE) signals. Simulated MESE decay curve (red) shows the expected decay pattern for $T_2$=100 ms without the effects of diffusion. Incorporating the effects of diffusion due to imaging gradients (blue) shows the extent of the diffusion bias, expected in realistic MRI experiment (FOV 1 cm, matrix 128×128, TE 8 ms and 1 mm slice thickness).

Figure 5:
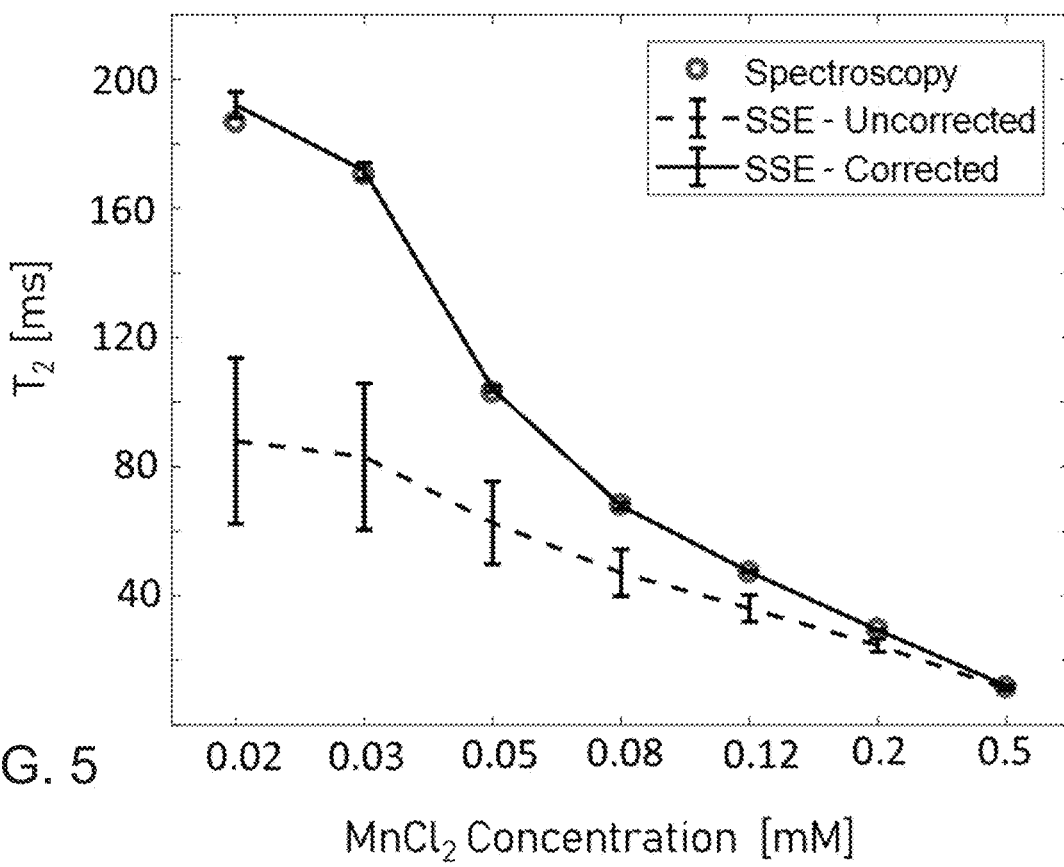

FIG. 5 shows SSE derived $T_2$ values (mean and SD) over different voxel sizes vs. concentration. $T_2$ values were acquired from SSE data of a phantom containing tubes with $MnCl_2$ concentrations ranging from 0.02 mM to 0.5 mM. Blue circles show spectroscopy results providing ground truth of $T_2$ values. Dashed line shows the $T_2$ values, fitted without accounting for diffusion effects, exhibiting very high variability of fitted values. Solid (green) line shows the results after correcting diffusion effects. Bars represent the variability over the different parameter sets (including different spatial resolutions, slice thickness and acquisition bandwidth).

Figure 6:
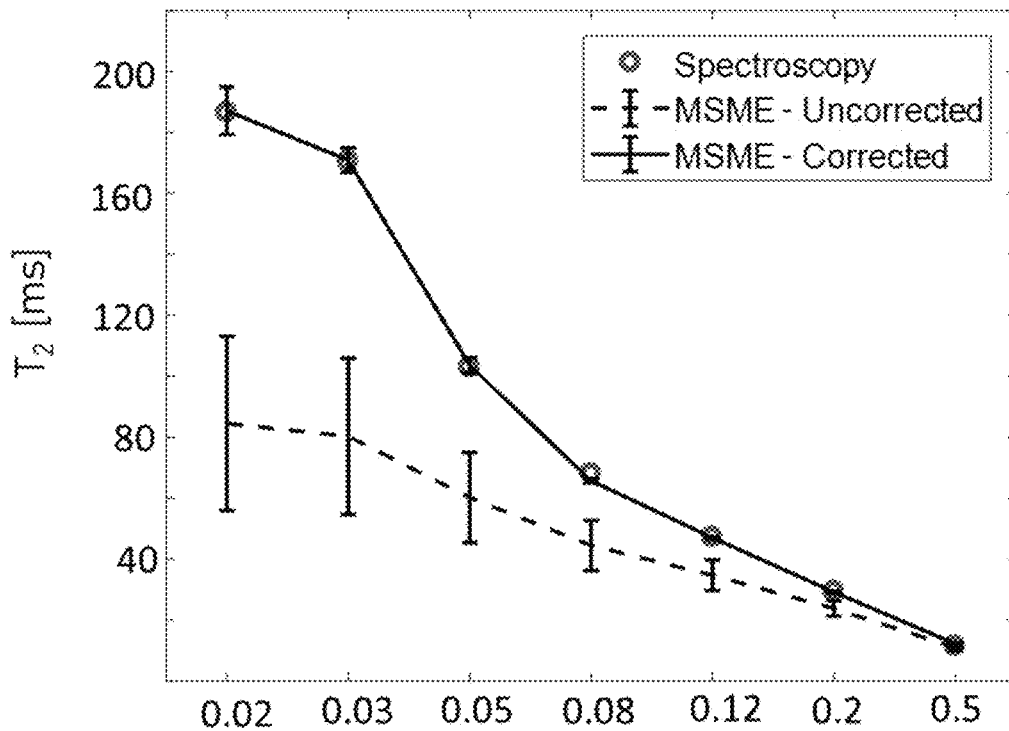

FIG. 6 shows MSME derived $T_2$ values (mean and SD) over different voxel sizes vs. concentration. $T_2$ values were acquired from SSE data of a phantom containing tubes with $MnCl_2$ concentrations ranging from 0.02 mM to 0.5 mM. Blue circles show spectroscopy results providing ground truth of $T_2$ values. Dashed line shows the $T_2$ values, fitted without accounting for diffusion effects, exhibiting very high variability of fitted values. Solid (green) line shows the results after correcting diffusion effects. Bars represent the variability over the different parameter sets including different spatial resolutions, slice thickness and acquisition bandwidth.

Figure 7:
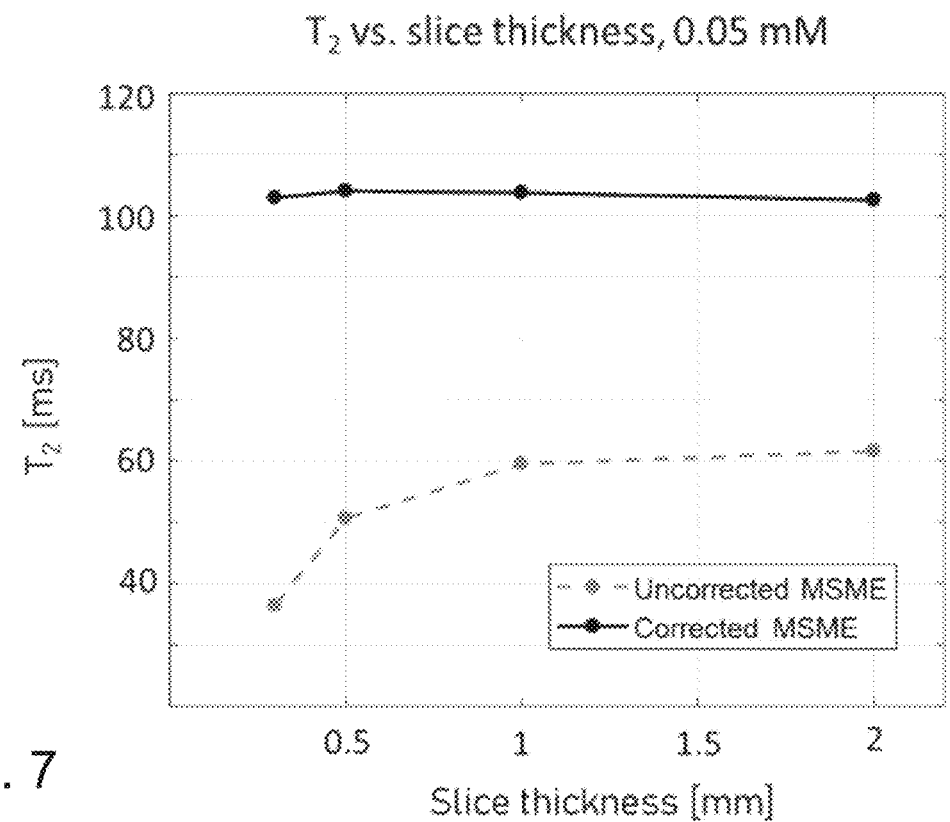

FIG. 7 shows $T_2$ values derived from MSME data of 0.05 mM $MnCl_2$ test tube across different spatial resolutions: 52, 71, 78, 104, 117, 208 μm. Spectroscopy ground-truth results: $T_2$=102.9 ms.

Figure 8:
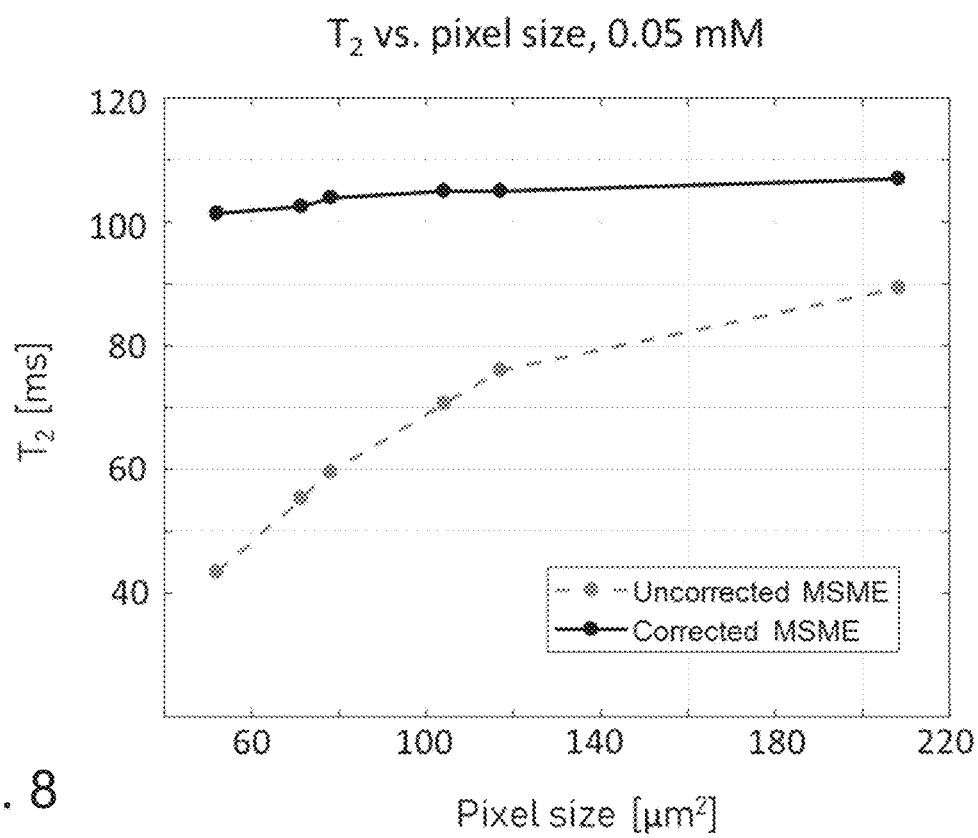

FIG. 8 shows $T_2$ values of one tube containing 0.05 mM $MnCl_2$ measured with slice thickness of 0.3, 0.5, 1, 2 mm. Spectroscopy ground-truth results: $T_2$=102.9 ms.

Figures 9A, 9B:
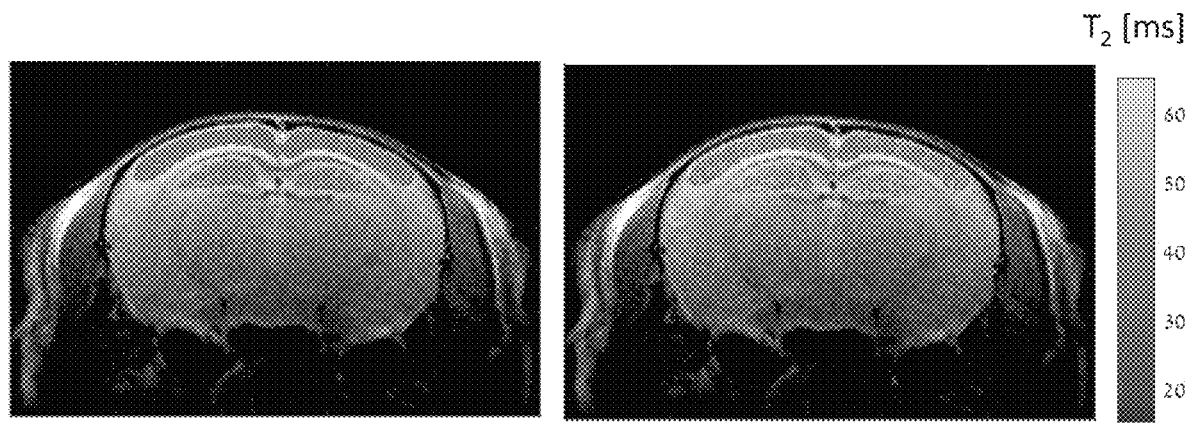

FIGS. 9A and 9B show $T_2$ maps fitted using the EMC algorithm, before diffusion correction (FIG. 9A) and after including diffusion decay (FIG. 9B).

Figure 9C:
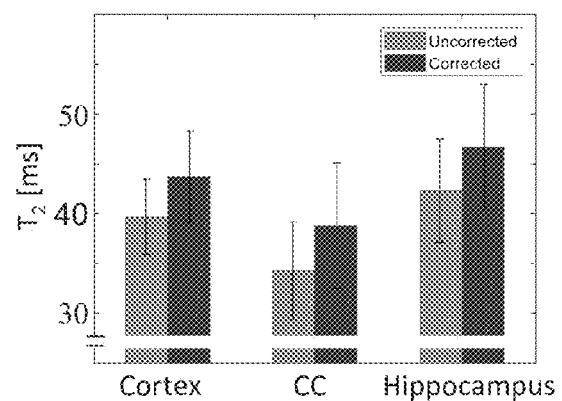

FIG. 9C shows averaged $T_2$ value and the SD for FIGS. 9A and 9B before and after diffusion correction. Voxel size 64×64×800 μm³

Figure 10:
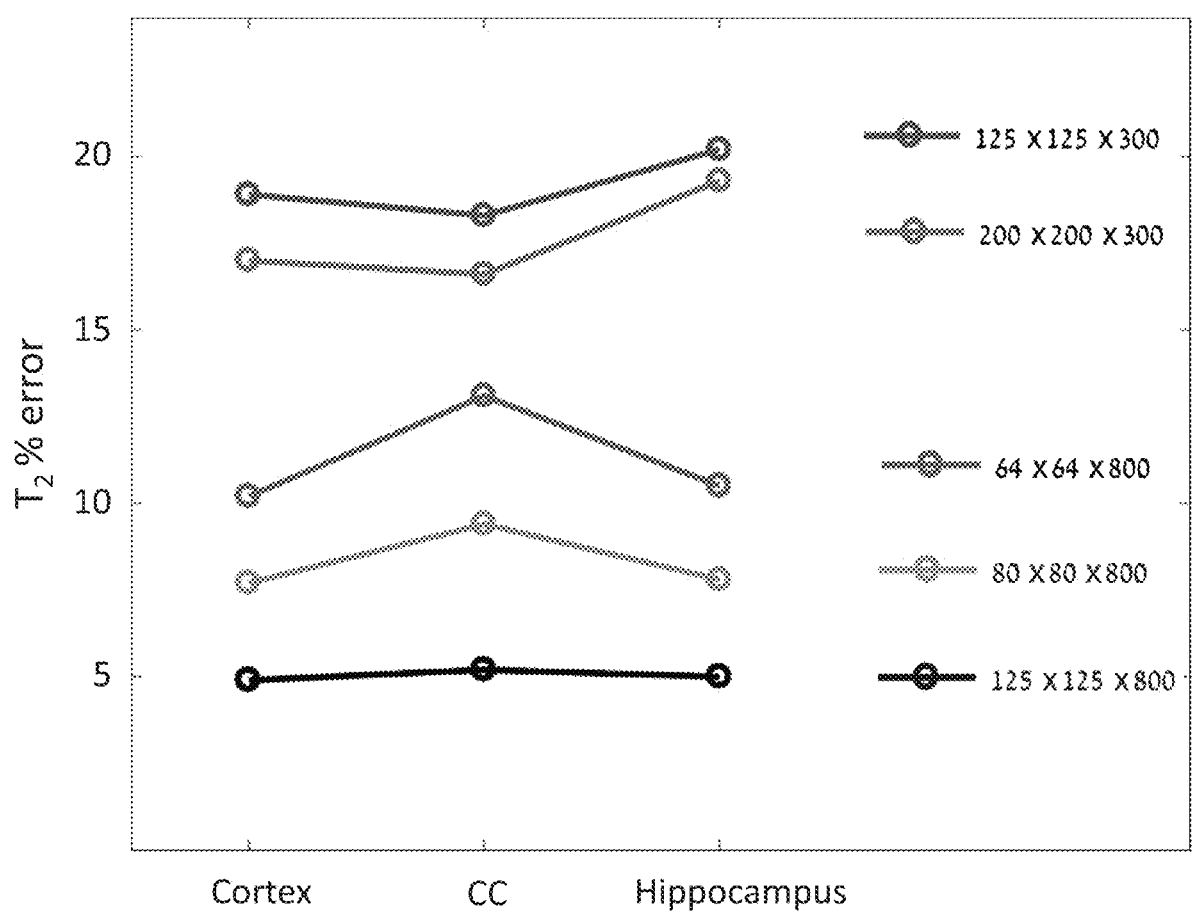

FIG. 10 shows error in $T_2$ values [%] when not accounting for diffusion effects, across different voxel sizes. Thinner slices exhibit higher errors in general, especially in the hippocampus. Higher in-plain resolution leads to relatively high errors in the CC.

Figure 11A:
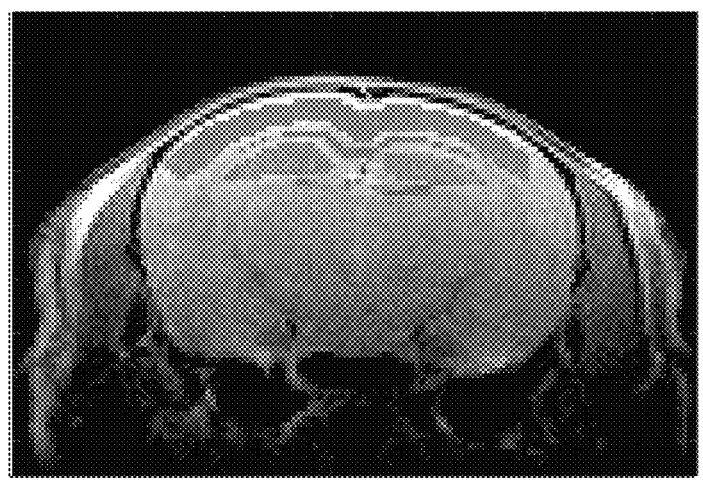
Figure 11B:
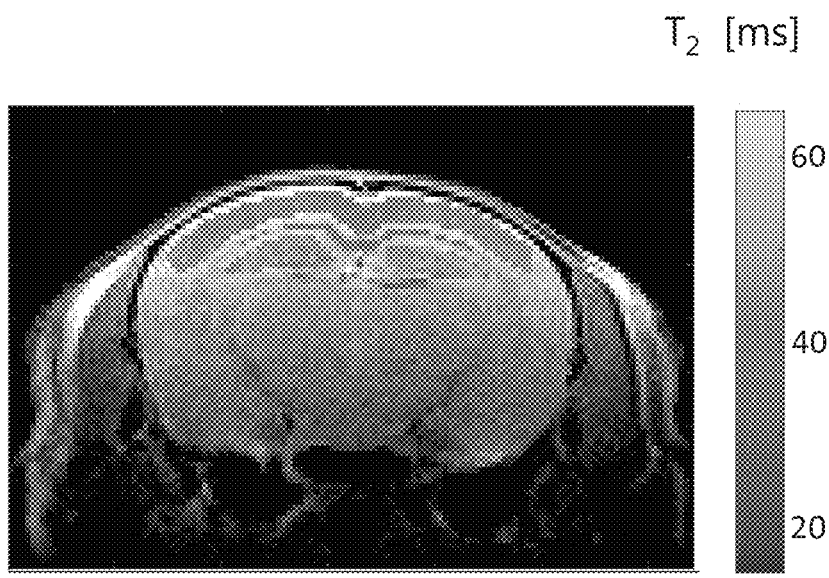
Figure 11C:
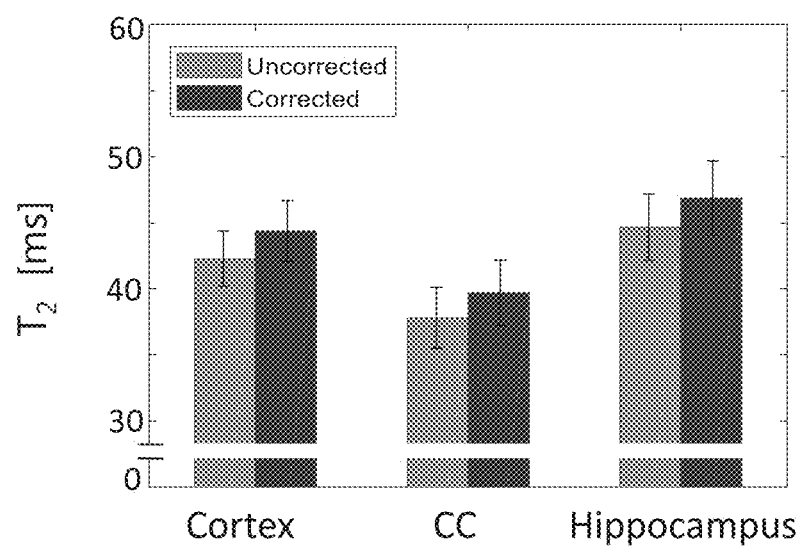

FIGS. 11A-C show $T_2$ maps (FIGS. 11A and 11B) and averaged values (FIG. 11C) of the cortex, cc and the hippocampus, for voxel size: 125×125×800 μm³, where FIG. 11A is an uncorrected $T_2$ map and FIG. 11B is a $T_2$ map after applying a correction.

Figure 12A:
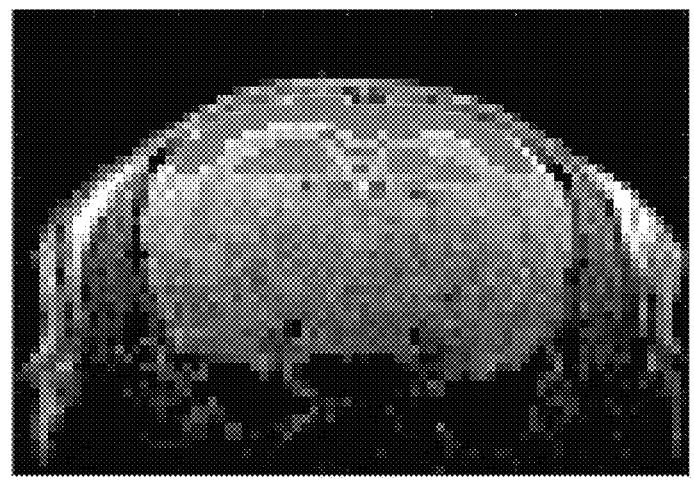
Figure 12B:
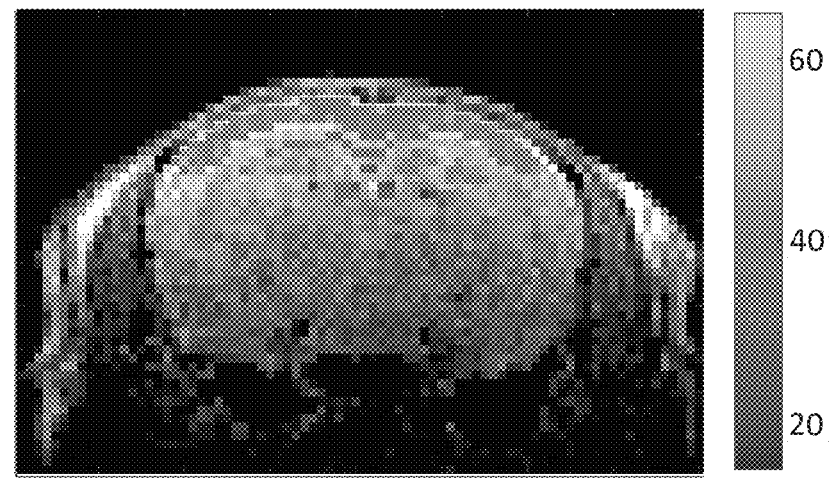
Figure 12C:
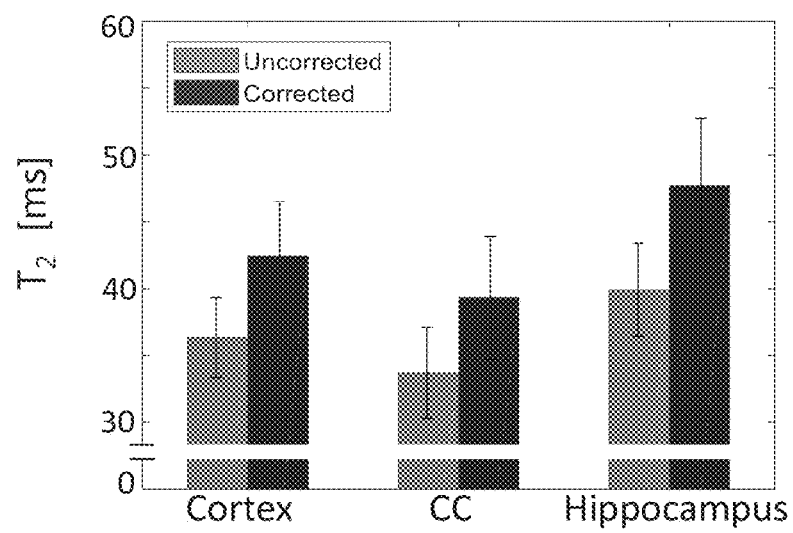

FIGS. 12A-C show $T_2$ maps (FIGS. 12A and 12B) and averaged values (FIG. 12C) of the cortex, cc and the hippocampus, for voxel size: 200×200×300 μm³, where FIG. 12A is an uncorrected $T_2$ map and FIG. 12B is a $T_2$ map after applying a correction.

Figure 13A:
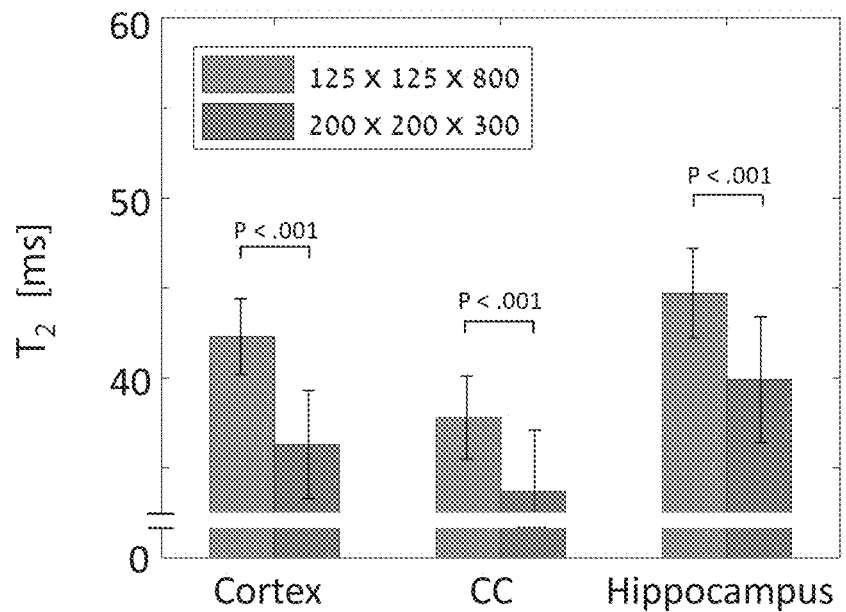
Figure 13B:
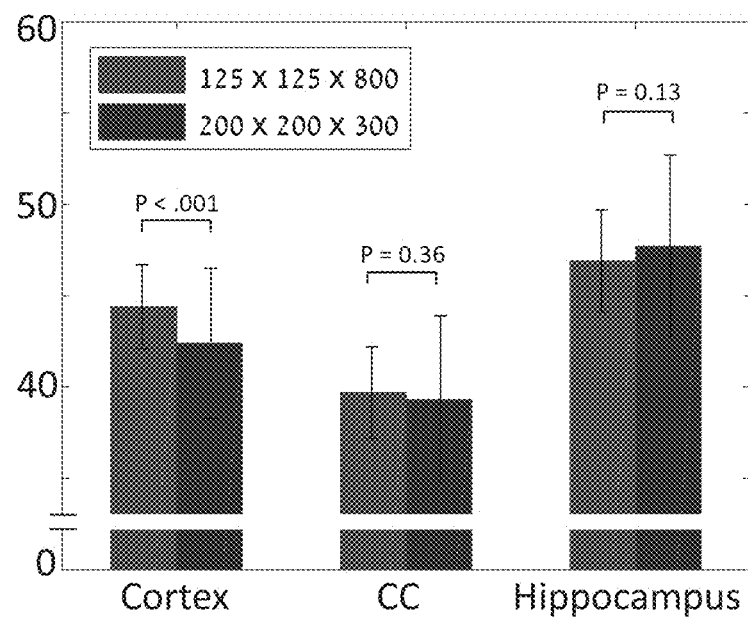

FIGS. 13A and 13B shows $T_2$ results of the scans shown FIGS. 11A-B and 12A-B, before (FIG. 13A) and after (FIG. 13B) correction.

Figure 14:
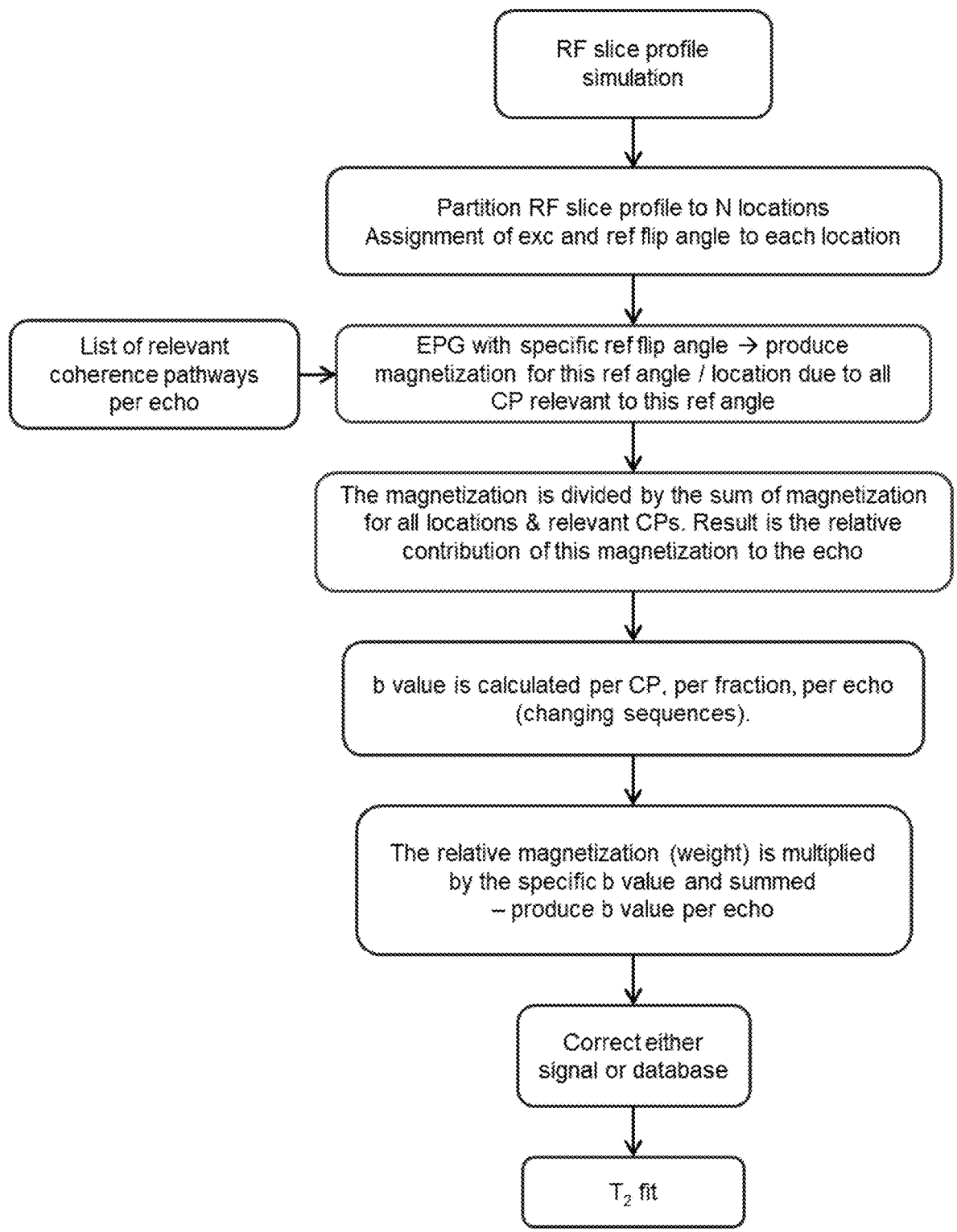

FIG. 14 illustrates a preferred procedure for generating a $T_2$ map.

DESCRIPTION OF SPECIFIC EMBODIMENTS OF THE INVENTION

The present invention, in some embodiments thereof, relates to magnetic resonance mapping and, more particularly, but not exclusively, to a method and system for generating transverse relaxation map in magnetic resonance scan. Optionally, the method and system generate transverse relaxation map in preclinical magnetic resonance scan.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Qualitative MRI scans are currently used for clinical diagnosis. As biological tissues differ in composition, they experience distinct relaxation leading to variations in signal intensity, thus generating high-resolution contrast images of internal organs to examine and detect abnormalities and lesions. The acquired contrast images are usually weighted by either $T_1$ or $T_2$ relaxation or by diffusion weighting. To produce a $T_2$ weighted image, the physiological range of transverse relaxation times is considered to achieve the desired differentiation between tissues.

Quantitative MRI refers to the extraction of numeric values from MR images. Although $T_2$ relaxation is one of the most commonly used contrasts in clinical diagnosis, quantitative $T_2$ mapping is currently performed in research. The inventors found that qMRI and particularly $qT_2$, can promote early detection, differentiate between disease states, replace invasive procedures and generally provide more information on tissue's condition. For example, the detection and characterization of cancer, musculoskeletal imaging, diagnosis of brain ischemic stroke, assessment of cognitive impairment in neurodegenerative diseases, assessment of diseased and post-transplant myocardial edema and cardiac imaging.

Preclinical MRI can be used in the research of in-vivo tissue composition, such as the analysis of the CNS (brain and spinal cord), fat tissues, skeletal muscles, and the like. It can also be utilized to investigate physiological function, such as, but not limited to, perfusion of the ovary and placenta, and cerebral blood flow.

Preclinical studies of animal models typically precede clinical trials (often referred to as bench to bedside), exploring diseases pathophysiology and their potential treatments. These models can be employed in many fields of biomedical research including, but not limited to, basic biology, immunology and infectious disease, oncology and behavior. For example, in the analysis of tissues and disease models, $qT_2$ can be calculated to characterize and differentiate between tissues, compare healthy and unhealthy regions and/or sick and treated specimens, e.g., stroke model, injury model, and research of lesions. Genetically engineered mouse models (GEMM) can be used to research genetic diseases via MRI. For instance mutant amyloid precursor protein (APP) and presenilin (PS1) for Alzheimer disease models, non-obese diabetic (NOD) mice.

Multi-echo spin-echo sequences (oftentimes abbreviated in the literature as multi spin-echo sequences) are affected by stimulated and indirect echoes caused by non-rectangular slice profiles. They are the result of imperfect refocusing RF pulses leading to varying refocusing angles across the slice and an array of coherence pathways which make up the signal.

The Inventors found that inadvertent diffusion weighting caused by the imaging gradients results in signal loss and underestimation of $T_2$ values. This is particularly the case in high-field and/or high resolution scans.

As gradients amplitude and time intervals increase signal decays. The scale of decay is a function of the diffusion coefficient D, and sequence timing and gradients, the last two are plugged into b-value. In addition, different scan parameters, primarily those relating to voxel size, produce different diffusion signal bias, leading to highly inconsistent results.

Homogenous materials can be characterized simply by D. Conversely, biological tissues are anisotropic, their geometry restricts and directs movement of molecules, thus they are characterized by a number of spatially dependent diffusion coefficients. The term apparent diffusion coefficient (ADC) is sometimes used instead of D to denote the observed diffusion rates or tensor components along different directions.

Since coherence pathways influence both attenuations, the imperfect refocusing angles is preferably considered when estimating $T_2$ relaxation and b-value. This condition is well-known, however solutions often refer to NMR sequence. Diffusion weighting of MESE scans is widely overlooked in imaging, when addressed it is usually based on the calculation of single spin echo.

The Inventors devised a technique for mapping transverse relaxation in a magnetic resonance (MR) scan data. The technique is particularly useful for preclinical MR scans, e.g., MR scans performed using an MRI system having a small bore size, for example, bore size of less than 50 cm or less than 40 cm, e.g., 30 cm or less. However, employing the technique for data acquired during a clinical MR scan is also contemplated. For example, the technique of the present embodiments can be employed for data acquired by whole-body and head MR scanners, such as, but not limited to, MR whole-body scanners generating magnetic field of at least 7T or at least 10.5T scanners, and MR head scanners generating magnetic field of at least 15T.

The technique of the present embodiments is advantageous when the MR scan data are acquired by an MRI system applying sufficiently high gradient amplitudes, e.g., of at least 80 mT/m, more preferably at least 100 mT/m. The technique of the present embodiments is also advantageous for high spatial resolution scan data, for example, scan data having spatial resolution of less than 300 µm×300 µm×1 mm, more preferably less than 300 µm×300 µm×800 µm, more preferably less than 250 µm×250 µm×800 µm, for example, about 200 µm×200 µm×800 µm, or less.

At least part of the operations described herein can be implemented by a data processing system, e.g., a dedicated circuitry or a general purpose computer, configured for receiving MR data and executing the operations described below. At least part of the operations can be implemented by a cloud-computing facility at a remote location.

Computer programs implementing the method of the present embodiments can commonly be distributed to users by a communication network or on a distribution medium such as, but not limited to, a floppy disk, a CD-ROM, a flash memory device and a portable hard drive. From the communication network or distribution medium, the computer programs can be copied to a hard disk or a similar intermediate storage medium. The computer programs can be run by loading the code instructions either from their distribution medium or their intermediate storage medium into the execution memory of the computer, configuring the computer to act in accordance with the method of this invention. During operation, the computer can store in a memory data structures or values obtained by intermediate calculations and pulls these data structures or values for use in subsequent operation. All these operations are well-known to those skilled in the art of computer systems.

Processing operations described herein may be performed by means of processer circuit, such as a DSP, microcontroller, FPGA, ASIC, etc., or any other conventional and/or dedicated computing system.

The method of the present embodiments can be embodied in many forms. For example, it can be embodied in on a tangible medium such as a computer for performing the method operations. It can be embodied on a computer readable medium, comprising computer readable instructions for carrying out the method operations. In can also be embodied in electronic device having digital computer capabilities arranged to run the computer program on the tangible medium or execute the instruction on a computer readable medium.

The method of the present embodiments uses input MRI parameters and process the MR scan data based on these parameters. In some embodiments of the present invention the method simulate echo modulation curve for each scan based on the MRI parameters. The slice is then optionally and preferably partitioned to a plurality of locations, each assigned with excitation and refocusing angle. The refocusing angle determines the projections of the magnetization along the x-y plane or along the z direction. The contribution of each relevant coherence pathway in each location to the overall magnetization can then be calculated, thus providing a plurality of local magnetization values. The local magnetization can then be divided by the sum of magnetizations of all relevant coherence pathways and locations, resulting in the relative contribution of this magnetization to the echo.

As refocusing angles affect the sequence, diffusion attenuation is calculated based on the pathway and optionally and preferably also on the specific refocusing angle along each of a plurality of gradient directions, e.g., RO (readout), PE (phase encoding) and SS (Spin Select) directions. The calculated diffusion attenuation can then be bused for correcting the simulated echo modulation curve, and the corrected curve can be compared to the MR scan data, thus allowing the generation of a transverse relaxation map.

Figure 1:
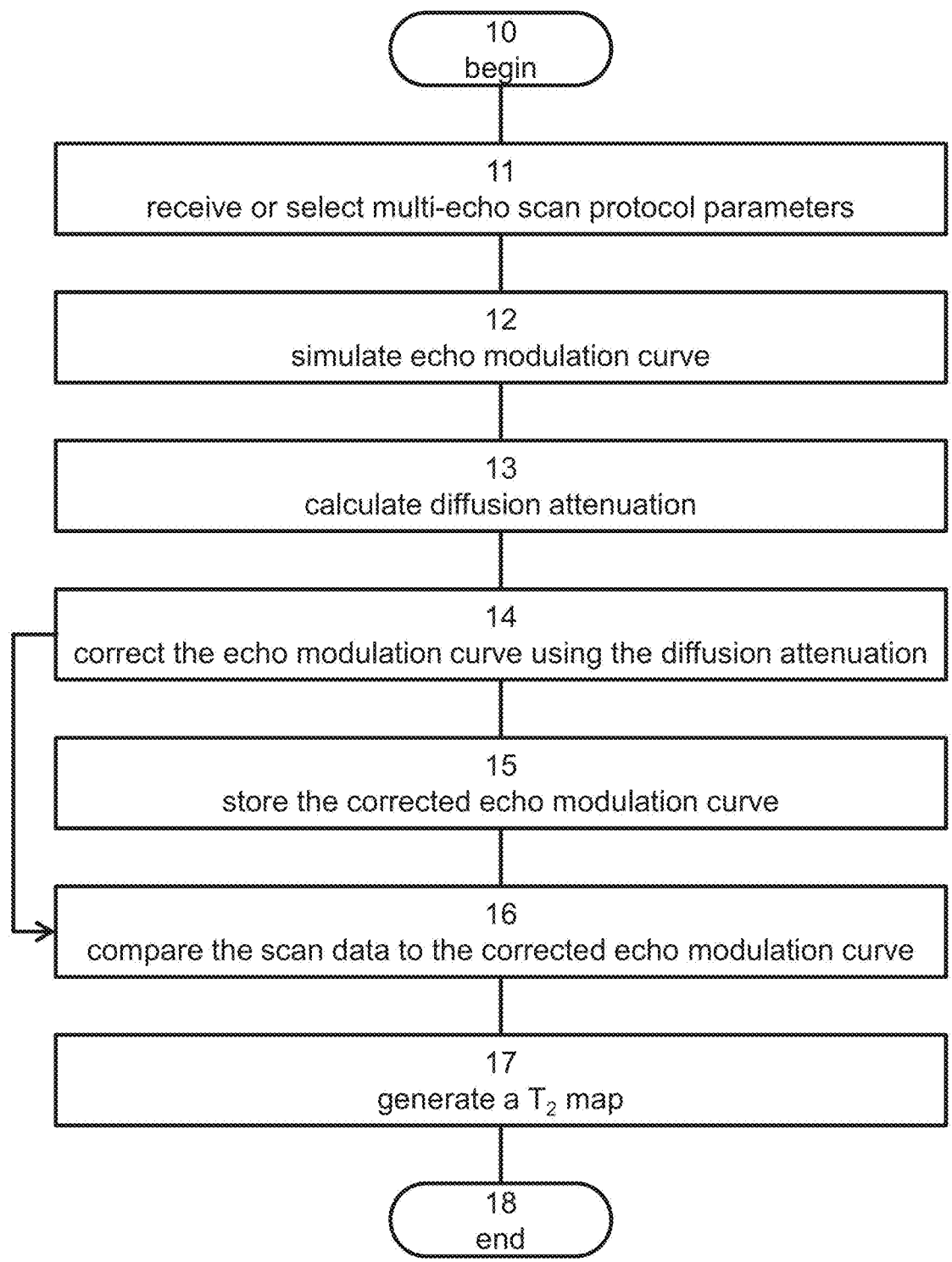

Referring now to the drawings, FIG. 1 is a flowchart diagram of a method suitable for mapping transverse relaxation in MR scan data according to some embodiments of the present invention.

It is to be understood that, unless otherwise defined, the operations described hereinbelow can be executed either contemporaneously or sequentially in many combinations or orders of execution. Specifically, the ordering of the flowchart diagrams is not to be considered as limiting. For example, two or more operations, appearing in the following description or in the flowchart diagrams in a particular order, can be executed in a different order (e.g., a reverse order) or substantially contemporaneously. Additionally, several operations described below are optional and may not be executed.

The method begins at 10 and optionally and preferably continues to 11 at which a multi-echo spin-echo (MESE) MR scan protocol is received or selected. The scan protocol comprises a plurality of MRI parameters. The parameters can include any of the parameters that are known to characterize the MESE MR scan, including, without limitation, matrix size, field-of-view (FOV), slice thickness, bandwidth (BW), pulse shape, refocusing angle, echo time (TE), repetition time (TR), a spatial distribution of the main magnetic field $B_0$, a frequency off-resonance of $B_0$, a spatial distribution of the secondary field $B_1$, and a radio-frequency (RF) pulse amplitude.

The method continues to 12 at which an echo modulation curve is simulated, optionally and preferably for each echo of the MESE MR scan protocol. The simulation of each echo can use a set of refocusing coherence pathways, for each of a plurality of predetermined transverse relaxation time ($T_2$) values, so that, preferably, there is a simulated echo modulation curve, for each echo, each predetermined $T_2$ value, and each refocusing coherence pathway. The plurality of predetermined $T_2$ values can be obtained in advance using any known technique for obtaining a plurality of discrete values. For example, $T_2$ values can be conveniently defined by employing a plurality of increments within a predetermined range of expected $T_2$ values. Alternatively, the $T_2$ values can be selected, optionally and preferably within a predetermined range, randomly or according to some criterion. A list of refocusing coherence pathways can also be prepared in advance, irrespectively of the MRI parameters, and stored in a computer readable medium, which is accessible by the method.

The echo modulation curves can be simulated using any technique known in the art. A representative example of a technique suitable for the present embodiments is disclosed in U.S. Pat. No. 10,281,544, the contents of which are hereby incorporated by reference. In these embodiments, one or more runs of a simulation of a prospective multi-echo spin-echo pulse sequence are performed using the parameters. The simulation(s) are preferably Bloch simulation(s). The run is repeated for the plurality of predetermined $T_2$, to produce a first set of echo modulation curves, each associated with a unique $T_2$.

In some embodiments of the present invention, the Bloch simulation uses a MESE protocol based on radial sampling of a Cartesian k-space. In these embodiments, the protocol scans each radial spoke. It is sufficient to scan each radial spoke only once. In some embodiments of the present invention there is a unique spoke ordering scheme. For example, the spoke ordering scheme can be selected to maximize the difference between each spoke, where the difference of the angles of the spokes is optionally and preferably as close as possible to 90°. Such maximization is advantageous because it distributes the spokes evenly around the k-space and minimizes any time-local motion artifacts. Another example is the use of golden-angle increments between each consecutive spokes. Further details regarding the simulation are found in U.S. Pat. No. 10,281,544.

At 13 the method calculates, for each of the predetermined $T_2$ values, diffusion attenuation based on a respective subset of the refocusing coherence pathways. In some embodiments of the present invention the method partitions a simulated slice profile into a plurality of partitions, and assigns a spin flip angle to each partition. The partitioning can be used for determining the subset of coherence pathways that contribute to each echo for the respective partition. The determination of the subset of coherence pathways can be by any procedure known in the art, such as, but not limited to, by direct simulation of the Bloch equations, or, more preferably by an Extended Phase Graph (EPG) procedure.

In some embodiments of the present invention, operation 13 includes calculating a b-value characterizing a diffusion for each coherence pathway of the subset. This provides a set of b-values, which can then be combined, for example, by summation, optionally and preferably a weighted summation. The weights for the summation can be calculated as relative contributions of a respective coherence pathway to a magnetization of the echo. For example, the weights can be calculated according to projections of the magnetization along the x-y plane or along the z direction, which projections can be computed using one or more of the received MRI parameters, particularly the refocusing angle.

The method proceeds to 14 at which the echo modulation curve is corrected using the diffusion attenuation. This can be done for example, by multiplying the echo modulation curve by a decay function that characterizes the diffusion attenuation. From 14 the method can proceed to 15 at which the corrected modulation curve is stored in a computer readable medium, and/or to 16 at which the scan data to be mapped is compared to the corrected echo modulation curves for each of at least a portion of the predetermined $T_2$ values. The comparison can optionally and preferably comprises using a piecewise linear correlation between the simulated curves and the MR scan data. The comparison is optionally and preferably voxel-wise wherein at each voxel (or each pixel of each slice) of the MR scan data the method compares the corrected echo modulation curves to the MR data that correspond to that voxel. From 16 the method optionally and preferably continues to 17 at which a $T_2$ map is generated, based on the comparison. For example, when the comparison is voxel-wise, the map can be generated by assigns each voxel with a $T_2$ value that corresponds to the curve that best matches the data acquired that voxel. The generated map can be displayed on a display, stored in a computer readable medium, and/or transmitted to a remoter location for displaying on a remote display or storing in a remote computer readable medium.

The method ends at 18.

In embodiments of the present invention in which operation 15 is executed, the stored corrected curves can be used as calibration data for an MR scanner. In these embodiments, the parameters received or selected at 11 can be parameters that are specific to the MR scanner, or include one or more predetermined values that are within ranges that are specific to the MR scanner. For example, suppose that the MR scanner is capable of working within some specific range of a particular parameter. In this case, the parameters received or selected at 11 can include one or more predetermined values for this particular parameter within the specific range, and operation 12 is optionally and preferably executed optionally and preferably for each of these predetermined values, so that the calibration data include a corrected curve for each of these values for the particular parameter.

The stored calibration data can be used for mapping transverse relaxation in MR scan data produced by the MR scanner. When it is desired to map transverse relaxation in MR scan data acquired by the MR scanner, the stored calibration data can be read from the computer readable medium and compared to the acquired scan data.

Figure 2:
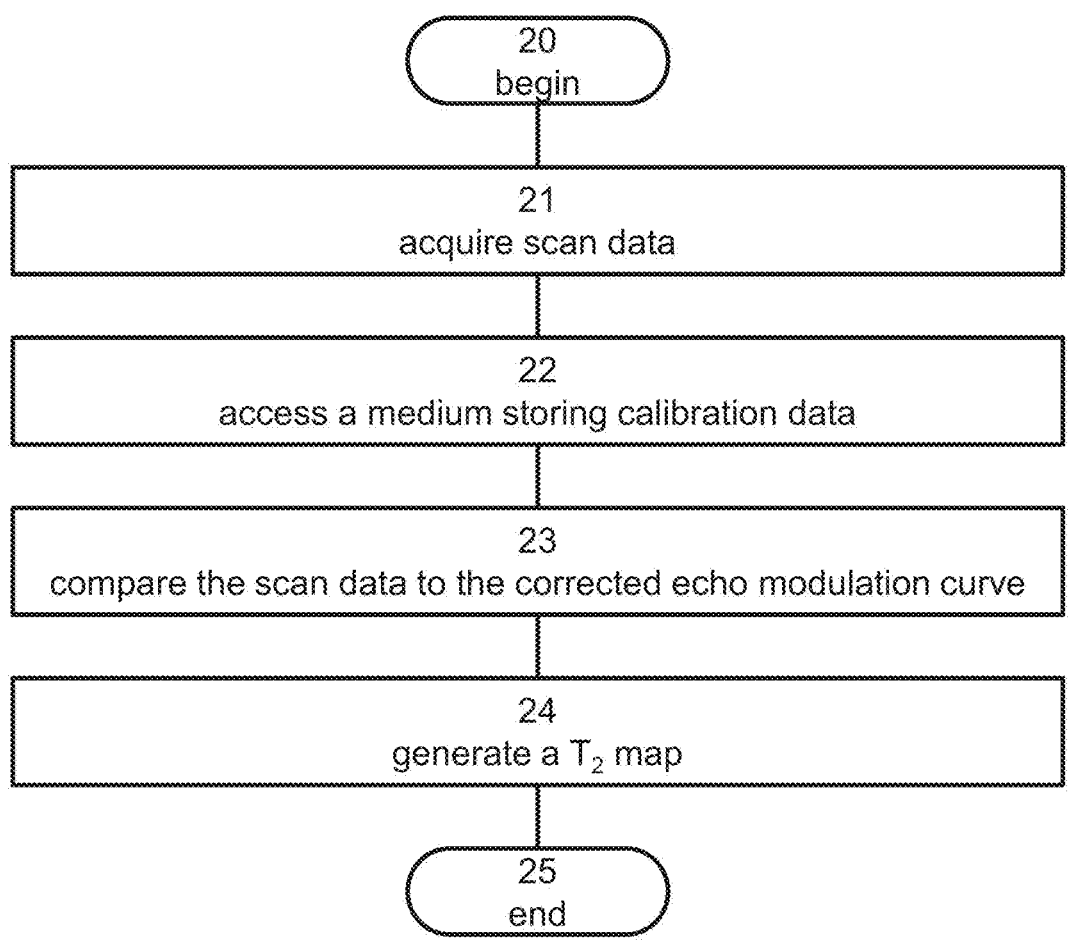

FIG. 2 is a flowchart diagram describing a method suitable for mapping transverse relaxation in MR scan data, using calibration data, according to some embodiments of the present invention. The method begins at 20 and optionally and preferably continues to 21 at which MR scan data are acquired from an object using an MR scanner. The object can be a phantom or a living or scarified animal, optionally and preferably a small mammal, e.g., a mouse, a rat, a rabbit, a frog, a hamster, a marten etc. The MR scanner preferably has a small bore size, for example, bore size of less than 50 cm or less than 40 cm, e.g., 30 cm or less. The acquisition 21 optionally and preferably uses sufficiently high gradient amplitudes, e.g., of at least 80 mT/m, more preferably at least 100 mT/m. The acquisition 21 is optionally and preferably executed to provide sufficiently high spatial resolution, e.g., spatial resolution characterized by a voxel size of less than 300 μm×300 μm×1 mm, more preferably less than 300 μm×300 μm×800 μm, more preferably less than 250 μm×250 μm×800 μm, for example, about 200 μm×200 μm×800 μm, or less.

Alternatively, the method can receive the MR scan data from an external source (e.g., a computer readable medium, or a cloud storage facility), in which case operation 21 can be skipped.

The method proceeds to 22 at which a computer readable medium storing calibration data is accessed. The calibration data optionally and preferably comprises a plurality of simulated echo modulation curves that are identified as corresponding to the set of MR parameters used to acquire the MR data, wherein each echo modulation curve corresponds to a unique $T_2$ value.

The calibration data can be generated by method 10 as further detailed hereinabove. The method proceeds to 23 at which the scan data is compared to a corrected echo modulation curve for each of at least a portion of the $T_2$ values of the calibration data, and to 24 at which at which a $T_2$ map is generated, based on the comparison, as further detailed hereinabove. The generated map can be displayed on a display, stored in a computer readable medium, and/or transmitted to a remoter location for displaying on a remote display or storing in a remote computer readable medium.

The method ends at 25.

As used herein the term "about" refers to ±10%

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

Example 1 qMRI performed mainly in research, has the potential to promote and improve diagnosis. Preclinical studies of animal models precede clinical trials (often referred to as bench to bedside), exploring diseases pathophysiology and their potential treatments. These models are employed in virtually all fields of biomedical research. More specifically, in the analysis of tissues and disease models, $qT_2$ is calculated to characterize and differentiate between tissues, compare healthy and unhealthy regions and/or sick and treated specimens. High-field preclinical scanners employ considerable imaging gradients to achieve suit-able spatial resolutions. These strong gradients result in inadvertent diffusion weighting and attenuation of the signal, particularly in multi-echo spin-echo sequences where the effect accumulates with each acquisition. Thus, accurate $T_2$ mapping involves tackling both diffusion-related underestimation of $T_2$ values, and the acknowledged problem of stimulated and indirect echoes caused by imperfect refocusing in MESE sequences. These stimulated and indirect echoes also influence diffusion decay. In addition, different scan parameters, primarily those relating to voxel size, will produce different diffusion and stimulated-echoes signal bias, leading to highly inconsistent results.

This Example characterizes diffusion decay caused by the imaging gradients in MESE scans by expanding the calculations of diffusion decay to include the stimulated and indirect echoes. Experiments, designed to test results consistency, were conducted on both phantoms and in-vivo models, scanned on a vertical 9.4 Tesla and horizontal 7 Tesla preclinical scanners respectively. Spectroscopy was performed to attain the unbiased phantom $T_2$ values.

After applying the suggested diffusion method, phantom $T_2$ results increased by up to 76%, they matched spectroscopy results with maximal deviation of 4%. In-vivo highest $T_2$ correction over 20%, was observed in the hippocampus. High accuracy and reproducibility in $T_2$ values were achieved, even for long $T_2$ values and extremely small voxel sizes.

This Example describes a comprehensive model, incorporating both $T_2$ and diffusion, considering the influence of coherence pathways in order to achieve accurate, reproducible, $T_2$ maps despite different parameter sets. Experiments, designed to test results consistency, were conducted on both phantoms and in-vivo models, scanned on a vertical 9.4 Tesla and horizontal 7 Tesla preclinical scanners respectively.

Theory

To quantify $T_2$ relaxation time, two methods are employed: single spin echo (SSE) and multi-echo spin-echo. The first is consisted of several SE scans, each one set with a specific echo time (TE), the latter involves one scan with multiple acquisitions—MESE.

All the gradients contribute to diffusion induced signal attenuation, especially when the time interval is long, the most notable gap is between the readout (RO) pre-phase and the actual RO, it is almost as long as TE.

The SSE decay curves are fitted exponentially, based on the following equation to extract $T_2$ (this is the solution to Bloch equations with transverse relaxation in the rotating frame).

$$M_{xy}(TE) = M_0 \exp(-TE/T_2)$$

where $M_0$ is the transverse magnetization immediately after excitation. To achieve $T_2$ mapping of a MESE scan, the echo modulation curve (EMC) simulation is used. It is based on Bloch equations, tracing stimulated and indirect echoes during an MESE acquisition, accounting for different slice profiles, RF pulse shapes, crusher gradients and spin relaxation during the RF pulses [N. Ben-Eliezer, D. K. Sodickson, and K. T. Block, "Rapid and accurate $T_2$ mapping from multi-spin-echo data using bloch-simulation-based reconstruction," Magn. Reson. Med., vol. 73, no. 2, pp. 809-817, 2015]. This algorithm produces a database with a range of $T_2$ values and $B1^+$ scaling, the acquired data is then fitted by solving an L2 norm minimization problem.

The Bloch-Torrey equations with diffusion terms can be written as:

$$\frac{dM}{dt} = \gamma M \times B - \frac{M_x \hat{i} + M_y \hat{j}}{T_2} - \frac{(M_z - M_0)\hat{k}}{T_1} + \nabla \cdot D \nabla M$$

where D represents the diffusion tensor.

The diffusion decay is determined by:

$$\frac{S}{S_0} = e^{-bD}, \quad b = \gamma^2 \delta^2 g^2 (\Delta - \delta/3)$$

where $S_0$ is the signal without diffusion attenuation, $\delta$ is the gradient duration, g is the gradient magnitude and $\Delta$ is the time interval between the gradients.

To develop b value based on the applied sequence, the area function of the gradient sequence is squared and integrated over time:

$$b\text{-value} = \gamma^2 \int_0^t \int_0^{t'} (g^*(t')dt')^2 dt$$

In MRI scans, imaging gradients are applied in three directions: RO (read out), PE (phase encoding) and SS (Spin Select); their magnitude is determined by the chosen parameter set, e.g., slice thickness, voxel size, field-of-view (FOV), with high resolution scans requiring stronger gradients. In addition to spatial resolution, the diffusion induced error is subjected to the chosen bandwidth (BW), echo time (TE), refocusing RF pulses and the sample's ADC values. Longer TE decreases the signal, it is equivalent to prolonging $\Delta$. The RF pulse shape determines the distribution of the magnetization's coherence pathways. This can lead to extended time intervals until re-phasing and an increase in diffusion induced decay. Variation between scans, set with different parameters, can be extremely high (see, e.g., FIG. 5).

Accordingly, diffusion attenuation is more substantial when imaging on preclinical scanners than clinical scanners, because smaller samples are examined, requiring much stronger magnetic field gradients. In addition, the effect is cumulative—as the echo train progresses the decay increases, thus high $T_2$ samples are most affected. An example of the simulated decay curve used to fit the MESE data before and after incorporating diffusion decay can be seen in FIG. 4.

In order to calculate b-value for MESE sequences, an algorithm was designed to evaluate the effective b-value per echo, based on the subset of coherence pathways that contributed to the signal, incorporating the effects of stimulated and indirect echoes in the assessment of diffusion attenuation. The contributing pathways magnetization is calculated and multiplied by the relevant b-value. Overall, there is one effective b-value per echo along three perpendicular directions, calculated for 20 echoes, with which the database is corrected.

Two types of scans are performed: the MESE scan and DTI-EPI to extract the ADCs along the perpendicular directions of the imaging gradients.

The algorithm used in this Example is illustrated in FIG. 14. The first part of the algorithm involves mapping the coherence pathways that contribute to each signal acquisition, including, without limitation, the direct echo, the stimulated echo and all the relevant indirect echoes. This mapping is independent of the MESE scan parameters, and it is used throughout the rest of the calculations. For each scan, the slice profile is simulated based on the data obtained from the scanner and the specific scan parameters. The slice is then partitioned to N locations, each assigned with excitation and refocusing angle. The refocusing angle determines the projections of the magnetization along the x-y plane or along z. The contribution of each relevant coherence pathways in each location to the overall magnetization is calculated, to provide a plurality of local magnetization values. This local magnetization is divided by the sum of magnetization of all relevant coherence pathways and locations, resulting in the relative contribution of this magnetization to the echo.

As refocusing angles affect the sequence, b value is calculated based on the pathway and the specific refocusing angle along RO, PE and SS. An effective PE gradient was evaluated based on the weighted intensities of the middle column in k-space multiplied by the array of applied PE gradients. The projections of the magnetization are used to determine the effects of sequence gradients on the magnetization. Each of these b-values is multiplied by the relative magnetization and by the coefficient of diffusion along the same axis, it is then summed up per echo and plugged into the exponential function yielding diffusion decay per echo. In this Example, the calculated diffusion decay was applied to correct the database, the corrected database was used to fit $T_2$ values.

Methods

Phantom

Figure 3:
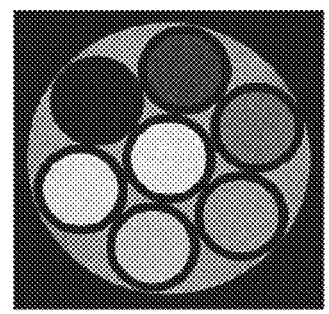

A phantom was made of seven concentrations of $MnCl_2$: 0.5, 0.2, 0.12, 0.08, 0.05, 0.03 and 0.02 mM. Seven 3 mm tubes containing these solutions were arranged in a 10 mm tube used for MR imaging. In addition, seven 5 mm tubes filled with each of the concentrations were scanned separately during the MR spectroscopy experiments, as shown in FIG. 3.

The separate phantom tubes were scanned on a 9.4 T Bruker Biospin, with the Generic Transceiver 1H 10 mm coil. Hahn S E protocol (SSE) was conducted on individual tubes. Four sets of scans were performed per tube with dwell time of either 5 or 10 μs and TE of 5 ms and 16 echoes or 8 ms TE with ETL of 18 echoes—overall 4 combinations. Diffusion scans were carried out as well to extract the coefficient of diffusion—SE with sinusoidal gradients, $\delta$=2 ms and $\Delta$ ranging from 10 to 30 ms.

The complete phantom was imaged to extract $T_1$ and $T_2$ values using the MSME protocol: Firstly, SSE with 19 inversion times (TI) ranging from 15 to 3000 ms, to extract $T_1$ values; Secondly, a series of SSE with different parameter sets, mainly varied voxel size (see Table 1), with TEs extending from 8 to 600 ms to calculate $T_2$ values; and thirdly, a series of MESE scans with a range of parameter sets elaborated in Table 2. Scan #1 was repeated 16 times (test retest) to examine variability due to noise. All phantom scans were performed at 25° C.

TABLE 1

| | SSE parameters | | | | |
| --- | --- | --- | --- | --- | --- |
| Scan | Matrix size | FOV [cm] | Slice thickness [mm] | BW [KHz] | TE [ms] | TR [s] |
| 1-4 | 128, 96, 140, 192 | 1 | 1 | 50 | 8 | 6 |
| 5 | 128 | 1.5 | 1 | 50 | 8 | 6 |
| 6 | 96 | 2 | 1 | 50 | 8 | 6 |
| 7-8 | 128 | 1 | 0.5, 2 | 50 | 8 | 6 |
| 9-10 | 128 | 1 | 1 | 75, 35 | 8 | 6 |

TABLE 2

MESE parameters

| Scan | Matrix size | FOV [cm] | Slice thickness [mm] | BW [KHz] | Pulse shape | Refoc. angle | TE [ms] | TR [s] |
|---|---|---|---|---|---|---|---|---|
| 1-4 | 128, 96, 140,192 | 1 | 1 | 50 | hermite | 180 | 8 | 6 |
| 5 | 128 | 1.5 | 1 | 50 | hermite | 180 | 8 | 6 |
| 6 | 96 | 2 | 1 | 50 | hermite | 180 | 8 | 6 |
| 7-9 | 128 | 1 | 0.3, 0.5, 2 | 50 | hermite | 180 | 8 | 6 |
| 10-11 | 128 | 1 | 1 | 75, 35 | hermite | 180 | 8 | 6 |
| 12-13 | 128 | 1 | 1 | 50 | Sinc, Gauss | 180 | 8 | 6 |
| 14 | 128 | 1 | 1 | 50 | hermite | 150 | 8 | 6 |
| 15-16 | 128 | 1 | 1 | 50 | hermite | 180 | 10, 12 | 6 |
| 17-19 | 128 | 1 | 1 | 50 | hermite | 180 | 8 | 2, 3, 10 |

In-Vivo

Mice were handled according to the Guide for the Care and Use of Laboratory Animals published by the National Research Council (NRC).

A healthy mouse brain was imaged on Bruker 7T Biospec with RF RES 300 1H 112/086 QSN TO AD coil, two protocols were executed: DTI-EPI and MSME. DTI scan had four b values. Slice location was set for both scans to ensure the DTI diffusion gradients were along the imaging gradients directions in the MSME scans. A series of MESE scans was performed, differing from one another in voxel sizes: 64×64×800, 80×80×800, 100×100×800, 125×125×800, 150×150×800, 125×125×300 and 200×200×300 $\mu m^3$.

Data Post-Processing

Spin echo spectroscopic measurements were used to extract phantom $T_2$ and ADC values, using exponential fit.

SSE $T_2$ maps were generated through exponential fit, regions of interest (ROI) were located in the center of each tube to calculate the value of each concentration. Each echo was then diffusion corrected to create a new fitted $T_2$ map.

MESE $T_2$ were generated using the EMC algorithm with the same ROIs as before. The b values of each echo were calculated, the database of the EMC algorithm was then attenuated according to the expected diffusion decay. The data was refitted to create a new $T_2$ map.

T1 values were fitted according to: $S \propto (1-2\exp(-T1/T1))M_0$

In vivo diffusivity along the imaging axes was extracted from the DTI data via exponential fit. Three areas were segmented: the cortex, the corpus callosum and the hippocampus. Their ADC values were used to compute diffusion attenuation and correct the $T_2$ database when fitting each specific segmented tissue.

As time elapsed, in-vivo scans had extremely low SNR ratio. To denoise the images, each image along the echo train was filtered: the noise level of ROIs outside the sample was measured and averaged per image, pixels with signal intensity equal to or less than twice the noise level were zeroed [Assaf et al., Magn. Reson. Med., vol. 44, no. 5, pp. 713-722, 2000].

Results

Phantom Results

Data of the individual tubes with $MnCl_2$ concentrations was fitted exponentially to extract the diffusion coefficient of the solutions at 25° C., returning D ≈$2.29 \times 10^{-5}$ $cm^2/s$ in all tubes. The Hahn S E $T_2$ results are shown in Table 3.

TABLE 3

Phantom $T_2$ Spectroscopy

| Conc. [mM] | $T_2$ [ms] |
|---|---|
| 0.5 | 11.5 ± 0.0 |
| 0.2 | 29.5 ± 0.1 |
| 0.12 | 47.2 ± 0.3 |
| 0.08 | 68.0 ± 0.4 |
| 0.05 | 102.9 ± 0.4 |
| 0.03 | 170.5 ± 2.8 |
| 0.02 | 186 ± 1.9 |

Table 4 has the averaged results of the SSE scans with various resolutions and slice thickness, as listed in Table 1, after diffusion correction. The overall phantom results are compared in FIGS. 5 and 6: $T_2$ values were averaged and the SD, representing the variance between scans with different scan parameters—resolution, slice thickness and BW, were calculated.

TABLE 4

Phantom SSE averaged diffusion corrected $T_2$ results
SSE

| Conc. [mM] | $T_2$ [ms] |
|---|---|
| 0.5 | 12.5 ± 0.6 |
| 0.2 | 29.4 ± 0.2 |
| 0.12 | 47.4 ± 0.3 |
| 0.08 | 67.9 ± 1.0 |
| 0.05 | 104.1 ± 1.0 |
| 0.03 | 171.7 ± 2.5 |
| 0.02 | 192.0 ± 4.0 |

For example, in both SSE and MESE 52×52 $\mu m^2$ pixel scans, the highest $T_2$ error was 70%, found in the lowest concentration tube. In the physiological range, $T_2$ errors were as high as 50%. After diffusion correction, $T_2$ values of the SSE MRI and NMR spectroscopy fitted nicely with an error of less than 1% in the physiological range. MESE corrected results also improved with maximal error of 4%.

For the 78×78 $\mu m^2$ pixel scan and 1 mm slice thickness, in both SSE and MESE, high $T_2$ values results without diffusion correction were 55% lower than the ground truth NMR spectroscopy results, $T_2$ values in the physiological range were lowered by up to 35% compared with the spectroscopy results. After diffusion correction, $T_2$ values of the SSE MRI and spectroscopy fitted nicely with error of less than 1% in the physiological range and maximal error of 3%. MESE corrected results also improved with maximal error of 4%.

Because the effect of diffusion is time dependent and becomes stronger with each echo it influences samples with high $T_2$ more severely. This can be seen in both the SSE and MESE results. After correction result were consistent, test retest results of the lowest concentration tube, 0.02 mM $MnCl_2$ (highest $T_2$), varied by approximately ±5%, in the physiological range variations had a slightly smaller scale—3% change.

FIGS. 7 and 8 show an example of the $T_2$=102.9 ms tube. The results of the MESE across several in-plane resolutions and slice thicknesses pre and post diffusion correction.

TABLE 5

Phantom $T_1$ Results
SSE

| Conc. [mM] | $T_1$ [ms] |
|---|---|
| 0.5 | 301.3 |
| 0.2 | 649.6 |
| 0.12 | 940.6 |
| 0.08 | 1200.0 |
| 0.05 | 1552.6 |
| 0.03 | 1965.8 |
| 0.02 | 2031.9 |

In-Vivo

Results varied in accordance with the chosen resolution and slice thickness. Thin slices voxels showed greater signal loss due to diffusion than voxels with thicker slices even when significantly higher in-plane resolution was selected.

ADC was calculated in the three directions of the imaging gradient per segmented tissue. Cortex: ADCx=$5.910 \times 10^{-6}$, ADCy=$5.493 \times 10^{-6}$, ADCz=$6.569 \times 10^{-6}$; corpus callosum: ADCx=$9.151 \times 10^{-6}$, ADCy=$4.204 \times 10^{-6}$, ADCz=$6.718 \times 10^{-6}$; and hippocampus ADCx=$5.734 \times 10^{-6}$, ADCy=$5.511 \times 10^{-6}$, ADCz=$6.583 \times 10^{-6}$ cm$^2$/s.

The lowest deviation in $T_2$ values, only 4-6% was demonstrated in the largest voxels in all the examined tissues, the highest deviation, more than 20%, was found in the narrowest voxel, not the overall smallest voxel. In these experiments the thickness of narrowest slices was 300 µm. In some cases, in-vivo scans are performed with slices as thin as 100 µm, they are expected to have $T_2$ deviation much higher than 20%, as diffusion decay becomes even stronger.

$T_2$ maps comparing results before and after diffusion correction of a high in-plane resolution scan are shown in FIGS. 9A-C, voxel size $64 \times 64 \times 800$ µm$^3$.

The results show that there is greater signal loss due to diffusion, and consequently lower extracted $T_2$ values in voxels with thinner slices, compared with higher in-plane resolution voxels. The difference is not only in scale, it is also tissue dependent.

FIG. 10 shows the $T_2$ percent error (compared to the uncorrected value). In addition to expressing greater errors, thin slices had the most significant error in $T_2$ values in the hippocampus whereas the smallest reduction was in the CC. In contrast, voxels with high in-plane resolution displayed the most extensive error in the CC, growing larger as resolution increased, the smallest reduction was in the cortex. The reason lies in tissues' ADC values. The hippocampus had higher ADC along z (SS), thus expressing greater error when the gradients along z (SS) were stronger (thinner slice). On the other hand, the CC had higher ADC along x (RO) which meant additional reduction as in-plane resolution and gradients along x (RO) increased.

FIGS. 11A-C, 12A-C, and 13A-B demonstrates $T_2$ maps and numeric averaged results prior and post diffusion correction of two scans. FIGS. 11A-C show maps with voxel size of $125 \times 125 \times 800$ µm$^3$, FIGS. 12A-C show maps with voxel size $200 \times 200 \times 300$ µm$^3$. FIGS. 13A and 13B show $T_2$ results of the scans in FIGS. 11A-B and 12A-C, before correction (FIG. 13A) and after correction (FIG. 13B).

The second scan had lower $T_2$ results without diffusion correction, post correction maps and values had good agreement between scans.

P-values were calculated to assess results variability. Tissues' $T_2$ values of different voxels were examined. Without considering diffusion weighting the compared results produced P<0.001 across tissues, indicating highly significant differences between scans. After diffusion correction P-values were raised as variability was reduced. Comparing the two scans shown in FIGS. 11B and 12B, after correction: the cortex had P <0.001, in the CC P=0.36 and the hippocampus P=0.13. Comparing the high in-plane resolution ($64 \times 64 \times 800$ µm$^3$) with a thin slice scan ($200 \times 200 \times 300$ µm$^3$) yielded P<0.001 in the cortex, P=0.37 in the CC and P=0.08 in the hippocampus; suggesting there was no significant variability in the CC and hippocampus $T_2$ results when diffusion correction was applied. Even though the cortex did not have a high P-value, results consistency has improved.

Discussion

Diffusion effect leads to significant underestimation of $T_2$ values on preclinical scanners due to high fields and high resolutions requiring strong gradients. This bias is subjected to the chosen resolution, slice thickness, bandwidth, refocusing RF pulses and the sample's diffusion coefficients along different directions.

In this Example aspects like the RF pulse shape and the actual refocusing angle along the slice have been considered to properly calculate diffusion decay in MESE sequences. These variations in refocusing angles result in different coherence pathways that can modify the effective b-value. The method of the present embodiments incorporate the influence of coherence pathways when calculating b-value.

As resolution changes diffusion signal decay varies. Reduced slice thickne was found to cause greater signal loss than increased in-plane resolutions, because, aside from gradients, thinner slices are characterized by imperfect slice profiles, producing additional coherence loss during acquisition due to the elongation of time intervals. The error also varies between tissues, narrow slices had the most significant $T_2$ error in the hippocampus, whereas in voxels with high in-plane resolution the most extensive error was found in the CC. Since both tissue's composition and geometry influence ADC values, combined with the specific gradient amplitude along the same direction, different tissues would undergo different $T_2$ corrections.

Eliminating diffusion decay from MESE acquisitions allows the extraction of accurate $T_2$ values. The phantom's extensive variability derived mainly from voxel size diminished to a range that can be attributed to noise. Before correction, highly significant differences (P <0.001) were observed in in-vivo $T_2$ results of different scans in all examined tissues. After diffusion correction no significant variability was found in the CC and the hippocampus (P >0.05).

Since the effect of diffusion is cumulative, it increases with each echo, thus influencing substances with longer $T_2$ values more severely. However, even with relatively short $T_2$ values, the described dependence on ADCs and voxel dimensions, particularly slice thickness leads to more than 20% reduction in $T_2$ values and remarkable variations due to diffusion (see FIG. 10). Thus, accurately estimating the error is advantageous, especially when considering the need for thin slices in in-vivo scans to minimize partial voluming.

Moreover, because signal attenuation is generally determined by: $e^{-bD} e^{-t/T_2}$, when observing a sample with relatively fast unrestricted molecular movement, the sample's slow transverse relaxation leads to increased signal while diffusion decreases it.

As high field scanners are more commonly used and scan resolutions become higher, effects such as the discussed diffusion bias is optionally and preferably quantified. This is also relevant for high field human scanners being continuously investigated for research and clinical uses including whole-body 7T and 10.5T scanners, and 15T head scanners.

Other aspects that can improve accuracy according to some embodiments of the present invention include: incorporating $B_1$ field inhomogeneity, $T_1$ relaxation, q-space analysis to extract the diffusion coefficients more accurately and improve in-vivo estimation of diffusion decay, and intravoxel incoherent motion (IVIM) analysis to extract D and correct the signal, considering perfusion and kurtosis and their effects on diffusion weighting in the long MESE sequence.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

It is the intent of the applicant(s) that all publications, patents and patent applications referred to in this specification are to be incorporated in their entirety by reference into the specification, as if each individual publication, patent or patent application was specifically and individually noted when referenced that it is to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

REFERENCES

[1] Ben-Eliezer N, Sodickson D K, Block K T. Rapid and accurate T2 mapping from multi-spin-echo data using bloch-simulation-based reconstruction. *Magn Reson Med.* 2015; 73(2):809-817. doi:10.1002/mrm.25156

[2] Shepherd T M, Kirov II, Charlson E, et al. New rapid, accurate $T_2$ quantification detects pathology in normal-appearing brain regions of relapsing-remitting MS patients. *NeuroImage Clin.* 2017; 14:363-370. doi: 10.1016/j.nicl.2017.01.029

[3] Farraher S W, Jara H, Chang K J, Ozonoff A, Soto J A. Differentiation of hepatocellular carcinoma and hepatic metastasis from cysts and hemangiomas with calculated $T_2$ relaxation times and the T1/T2 relaxation times ratio. *J Magn Reson Imaging.* 2006; 24(6): 1333-1341. doi: 10.1002/jmri.20758

[4] Liu W, Turkbey B, Sénégas J, et al. Accelerated $T_2$ mapping for characterization of prostate cancer. *Magn Reson Med.* 2011; 65(5):1400-1406. doi:10.1002/mrm.22874

[5] Jordan C D, Saranathan M, Bangerter N K, Hargreaves B A, Gold G E. Musculoskeletal MRI at 3.0 T and 7.0 T: A comparison of relaxation times and image contrast. *Eur J Radiol.* 2013; 82(5):734-739. doi:10.1016/j.ejrad.2011.09.021

[6] Pan J, Pialat J-B, Joseph T, et al. Knee Cartilage $T_2$ Characteristics and Evolution in Relation to Morphologic Abnormalities Detected at 3-T MR Imaging: A Longitudinal Study of the Normal Control Cohort from the Osteoarthritis Initiative. *Radiology.* 2011; 261(2):507-515. doi:10.1148/radiol11102234

[7] Mosher T J, Zhang Z, Reddy R, et al. Knee articular cartilage damage in osteoarthritis: analysis of MR image biomarker reproducibility in ACRIN-PA 4001 multicenter trial. *Radiology.* 2011; 258(3):832-842. doi:10.1148/radiol10101174

[8] Dardzinski B J, Mosher T J, Li S, Van Slyke M A, Smith M B. Spatial variation of T2 in human articular cartilage. *Radiology.* 2014. doi:10.1148/radiology.205.2.9356643

[9] Siemonsen S, Mouridsen K, Hoist B, et al. Quantitative T2 values predict time from symptom onset in acute stroke patients. *Stroke.* 2009; 40(5):1612-1616. doi: 10.1161/STROKEAHA.108.542548

[10] Cury R C, Shash K, Nagurney J T, et al. Cardiac magnetic resonance with T2-weighted imaging improves detection of patients with acute coronary syndrome in the emergency department. *Circulation.* 2008; 118(8):837-844. doi: 10.1161/CIRCULATIONAHA.107.740597

[11] Eitel I, Friedrich M G. T2-weighted cardiovascular magnetic resonance in acute cardiac disease. *J Cardiovasc Magn Reson.* 2011; 13(1):1-11. doi:10.1186/1532-429X-13-13

[12] McCreary C, Kelly D, Tomanek B, Foniok T, Kirk D, Dunn J. Multicomponent T2 analysis of rat brain and spinal cord at 9.4 T. *Proc 14th Sci Meet Int Soc Magn Reson Med.* 2006;(December 2014):961. /MyPathway2006/0961.

[13] Lunati E, Marzola P, Nicolato E, Fedrigo M, Villa M, Sbarbati A. In vivo quantitative lipidic map of brown adipose tissue by chemical shift imaging at 4.7 tesla. *J Lipid Res.* 1999; 40(8):1395-1400.

[14] Zhang J, Zhang G, Morrison B, Mori S, Sheikh K A. Magnetic resonance imaging of mouse skeletal muscle to measure denervation atrophy. *Exp Neurol.* 2008; 212(2): 448-457. doi: 10.1016/j.expneurol2008.04.033

[15] Tempel C, Neeman M. Perfusion of the rat ovary: Application of pulsed arterial spin labeling MRI. *Magn Reson Med.* 1999; 41(1):113-123. doi:10.1002/(SICI) 1522-2594(199901)41: 1<113:AID-MRM16>3.0.00;2-G

[16] Solomon E, Avni R, Hadas R, et al. Major mouse placental compartments revealed by diffusion-weighted MRI, contrast-enhanced MRI, and fluorescence imaging. *Proc Natl Acad Sci USA.* 2014; 111(28):10353-10358. doi:10.1073/pnas.1401695111

[17] McGarry B L, Jokivarsi K T, Knight M J, Grohn O H J, Kauppinen R A. A magnetic resonance imaging protocol for stroke onset time estimation in permanent cerebral ischemia. *J Vis Exp.* 2017; 2017(127):1-6. doi: 10.3791/55277

[18] Oakden W, Kwiecien J M, O'Reilly M A, et al. Quantitative MRI in a non-surgical model of cervical spinal cord injury. *NMR Biomed.* 2015;28(8):925-936. doi:10.1002/nbm.3326

[19] Noam B-E, K. S D, Tobias B K. Rapid and accurate T2 mapping from multi-spin□echo data using Bloch-simulation-based reconstruction. *Magn Reson Med.* 73(2):809-817. doi:10.1002/mrm.25156

[20] Lebel R M, Wilman A H. Transverse relaxometry with stimulated echo compensation. *Magn Reson Med.* 2010; 64(4):1005-1014. doi:10.1002/mrm.22487

[21] McPhee K C, Wilman A H. Limitations of skipping echoes for exponential T 2 fitting. *J Magn Reson Imaging.* 2018; 48(5): 1432-1440. doi:10.1002/jmri.26052

[22] Ben-Eliezer N, Sodickson D K, Shepherd T, Wiggins G C, Block K T. Accelerated and motion-robust in vivo T 2 mapping from radially undersampled data using bloch-simulation-based iterative reconstruction. *Magn Reson Med.* 2016; 75(3):1346-1354. doi:10.1002/mrm.25558

[23] Woessner D E. Effects of diffusion in nuclear magnetic resonance spin-echo experiments. *J Chem Phys.* 1961; 34(6):2057-2061. doi:10.1063/1.1731821

[24] Neeman M, Freyer J P, Sillerud L O. Pulsed-gradient spin-echo diffusion studies in nmr imaging. Effects of the imaging gradients on the determination of diffusion coefficients. *J Magn Reson.* 1990; 90(2):303-312. doi: 10.1016/0022-2364(90)90136-W

[25] Oakden W, Stanisz G J. Effects of diffusion on high-resolution quantitative T2 MRI. *NMR Biomed.* 2014; 27(6):672-680. doi:10.1002/nbm.3104

What is claimed is:

1. A method of mapping transverse relaxation in a magnetic resonance (MR) scan data, the method comprising:
    receiving a multi-echo spin-echo MR scan protocol comprising a plurality of MR imaging parameters;
    for each echo of said multi-echo spin-echo MR scan protocol:
    generating, based on said parameters, a simulated echo modulation curve using a set of refocusing coherence pathways, for each of a plurality of predetermined transverse relaxation times;
    calculating, for each transverse relaxation time, diffusion attenuation based on a respective subset of said refocusing coherence pathways;
    correcting said echo modulation curve using said diffusion attenuation;
    comparing the scan data to said corrected echo modulation curve for each of at least a portion of said transverse relaxation values; and
    generating a displayed output comprising a map of transverse relaxation based on said comparison.

2. The method according to claim 1, wherein the MR scan is a preclinical MR scan.

3. The method according to claim 1, wherein said calculating said diffusion attenuation comprises calculating a b-value characterizing a diffusion for each coherence pathway of said subset.

4. The method according to claim 3, wherein said diffusion attenuation comprises a weighted sum of b-values of different coherence pathway.

5. The method according to claim 4, further comprising calculating weights for said weighted sum as relative contributions of a respective coherence pathway to a magnetization of said echo.

6. The method according to claim 1, wherein said calculating said diffusion attenuation comprises partitioning a simulated slice profile into a plurality of partitions, and assigning a spin flip angle to each partition.

7. The method according to claim 6, further comprising applying Extended Phase Graph (EPG) procedure to determine said subset of coherence pathways that contribute to each echo and to each partition to provide a magnetization value for said partition.

8. The method according to claim 1, wherein said magnetic resonance (MR) scan data are characterized by typical gradient amplitudes of at least 80 mT/m.

9. The method according to claim 1, wherein said magnetic resonance (MR) scan data are characterized by typical gradient amplitudes of at least 100 mT/m.

10. The method according to claim 1, wherein said magnetic resonance (MR) scan data are characterized by spatial resolution of less than 300 µm×300 µm×1 mm.

11. The method according to claim 1, wherein said magnetic resonance (MR) scan data are acquired by an MRI scanner having a bore size of 50 cm or less.

12. A method of generating calibration data for a magnetic resonance (MR) scanner, the method comprising:
    receiving a multi-echo spin-echo MR scan protocol comprising a plurality of MR imaging parameters;
    for each echo of said multi-echo spin-echo MR scan protocol:
    generating, based on said parameters, a simulated echo modulation curve using a set of refocusing coherence pathways, for each of a plurality of predetermined transverse relaxation times;
    calculating, for each transverse relaxation time, diffusion attenuation based on a respective subset of said refocusing coherence pathways;
    correcting said echo modulation curve using said diffusion attenuation; and
    storing said corrected echo modulation curves in a computer readable medium.

13. The method according to claim 12, wherein the MR scanner is a preclinical MR scanner.

14. The method according to claim 12, wherein the MR scanner has a bore size of less than 40 cm.

15. A method of mapping transverse relaxation in a magnetic resonance (MR) scan data acquired by an MR scanner according to a multi-echo spin-echo MR scan protocol comprising a set of MR imaging parameters, the method comprising:
    accessing a computer readable medium storing calibration data, said calibration data comprising a plurality of simulated echo modulation curves that are identified as corresponding to the set of MR imaging parameters, wherein each echo modulation curve corresponds to a unique transverse relaxation value;
    comparing said scan data to an echo modulation curve for each of at least a portion of said transverse relaxation values of said calibration data; and
    generating a displayed output comprising a map of transverse relaxation based on said comparison.

16. The method according to claim 15, wherein the MR scan is a preclinical MR scan.

17. The method according to claim 12, wherein said magnetic resonance (MR) scan data are characterized by typical gradient amplitudes of at least 80 mT/m.

18. The method according to claim 12, wherein said magnetic resonance (MR) scan data are characterized by typical gradient amplitudes of at least 100 mT/m.

19. The method according to claim 12, wherein said magnetic resonance (MR) scan data are characterized by spatial resolution of less than 300 µm×300 µm×1 mm.

20. The method according to claim 12, wherein said magnetic resonance (MR) scan data are acquired by an MRI scanner having a bore size of 50 cm or less.

* * * * *